(12) United States Patent
Kondo et al.

(10) Patent No.: US 6,901,027 B2
(45) Date of Patent: May 31, 2005

(54) APPARATUS FOR PROCESSING DATA, MEMORY BANK USED THEREFOR, SEMICONDUCTOR DEVICE, AND METHOD FOR READING OUT PIXEL DATA

(75) Inventors: Tetsujiro Kondo, Tokyo (JP); Hiroshi Sato, Kanagawa (JP); Hideo Nakaya, Kanagawa (JP); Kazutaka Ando, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 10/425,449

(22) Filed: Apr. 29, 2003

(65) Prior Publication Data

US 2004/0001365 A1 Jan. 1, 2004

(30) Foreign Application Priority Data

Apr. 30, 2002 (JP) ........................................ 2002-128766
May 2, 2002 (JP) ........................................ 2002-130347

(51) Int. Cl.$^7$ ................................................. G11C 8/00
(52) U.S. Cl. ........................................ 365/240; 382/236
(58) Field of Search ............................ 365/199, 230.03, 365/240; 382/236, 238

(56) References Cited

U.S. PATENT DOCUMENTS 6,181,632 B1 * 1/2001 Kondo et al. .......... 365/230.03

OTHER PUBLICATIONS

Patent Abstract of Japan, 2000–076845, publication date, Mar. 14, 2000.
Patent Abstract of Japan, 2003–109380, publication date, Apr. 11, 2003.
Patent Abstract of Japan, 2003–208789, publication date, Jul. 25, 2003.
JP2003288789, MicroPatent Report; Semiconductor Memory Device, publication date Oct. 10, 2003.

* cited by examiner

*Primary Examiner*—Richard Elms
*Assistant Examiner*—Hien Nguyen
(74) *Attorney, Agent, or Firm*—Frommer Lawrence & Haug LLP; William S. Frommer

(57) ABSTRACT

In each of the memory cell arrays in the memory banks, a memory cell row corresponding to each of the word lines extending in a column direction of each of the memory cell arrays store pixel data of each pixel block of first and second rows set in a horizontal way in a search area within a search frame of picture signal. The pixel data of a predetermined pixel block is selectively captured into each of the data buffer through the sense amplifiers and the switches. Selector sequentially extracts pixel data as candidate blocks based on the pixel data of two pixel blocks held in each of the data buffers. The matching circuit matches the pixel data as the extracted candidate blocks against the pixel data as the input reference block using the block-matching process to obtain a motion vector relative to the reference block.

11 Claims, 18 Drawing Sheets

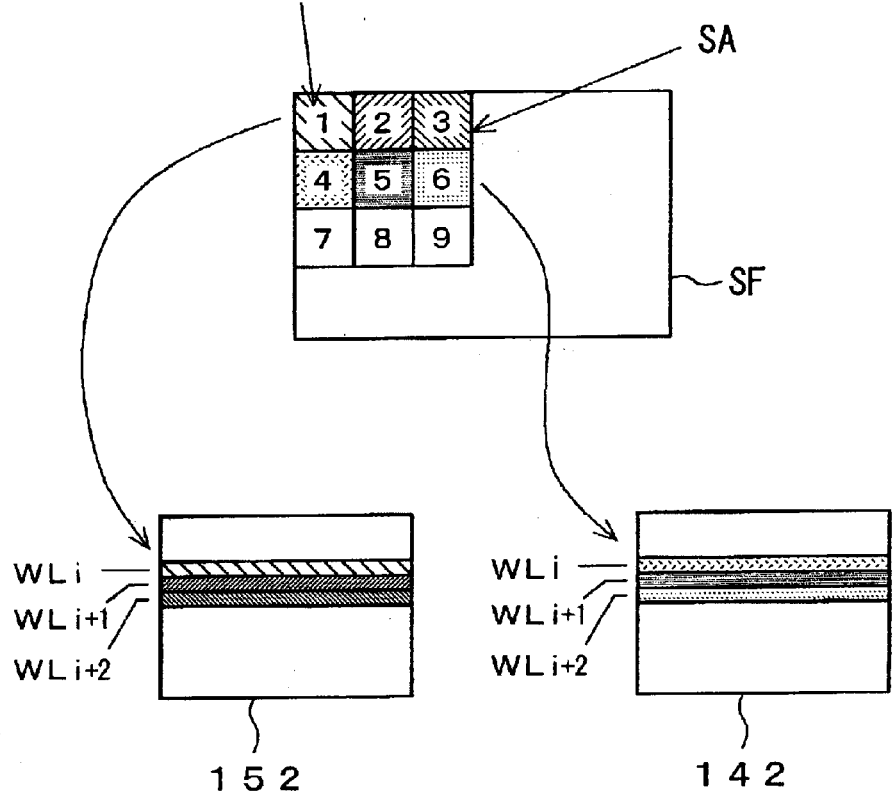

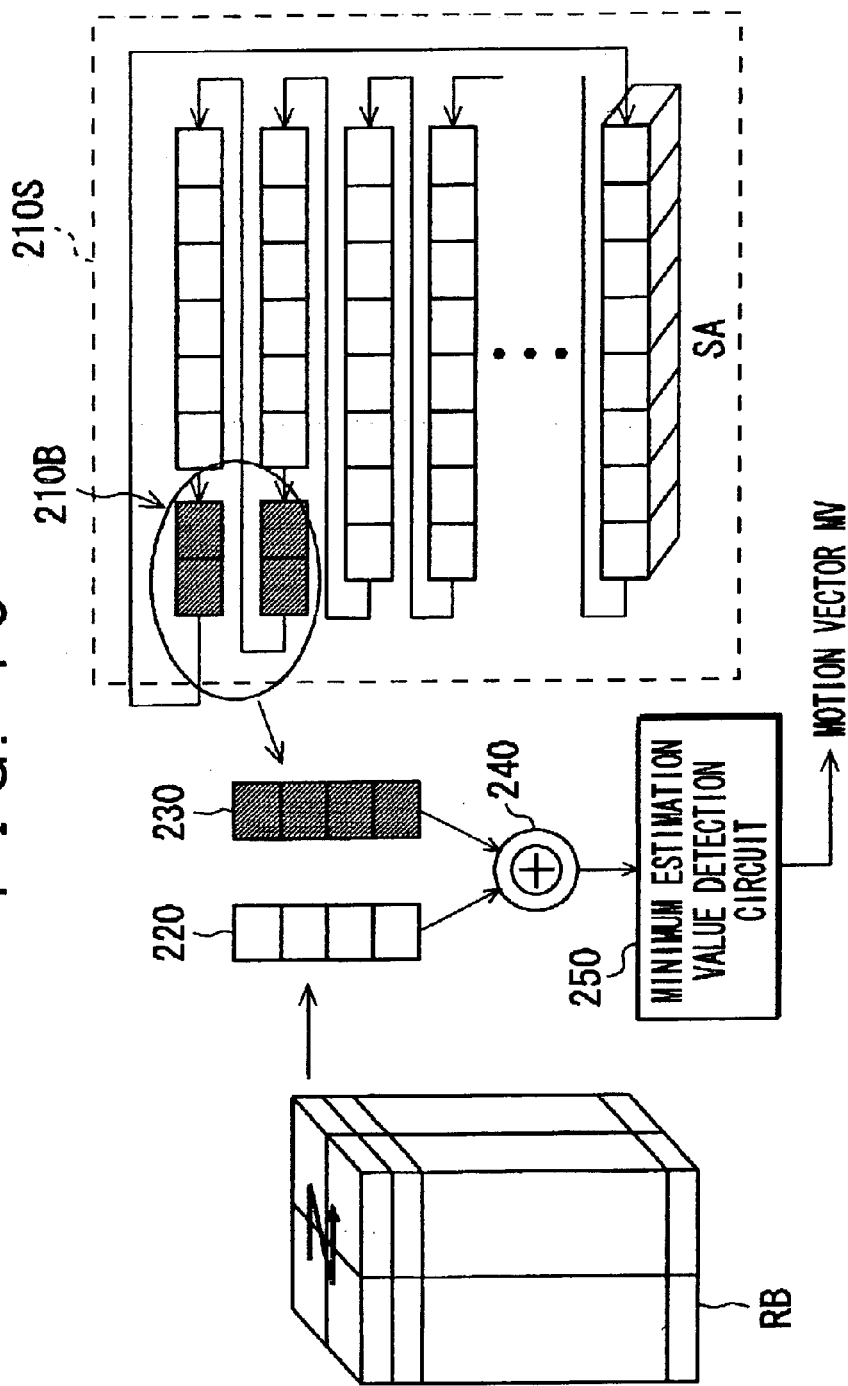

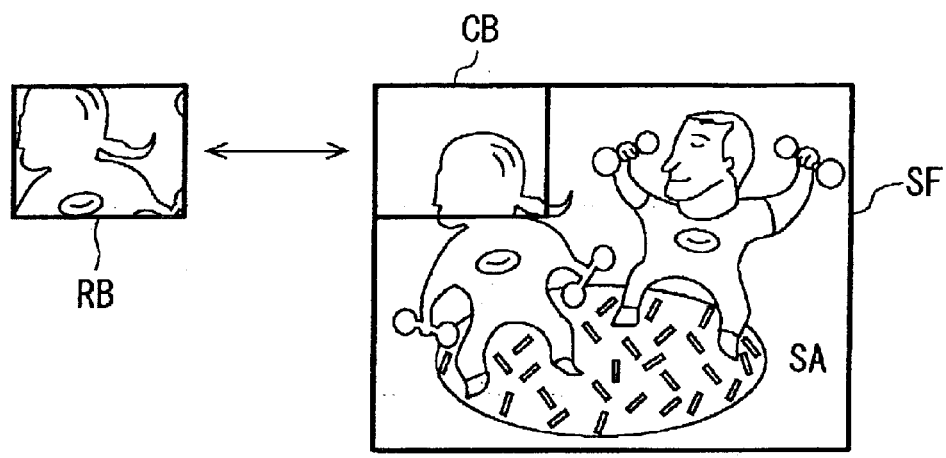
F I G. 16A
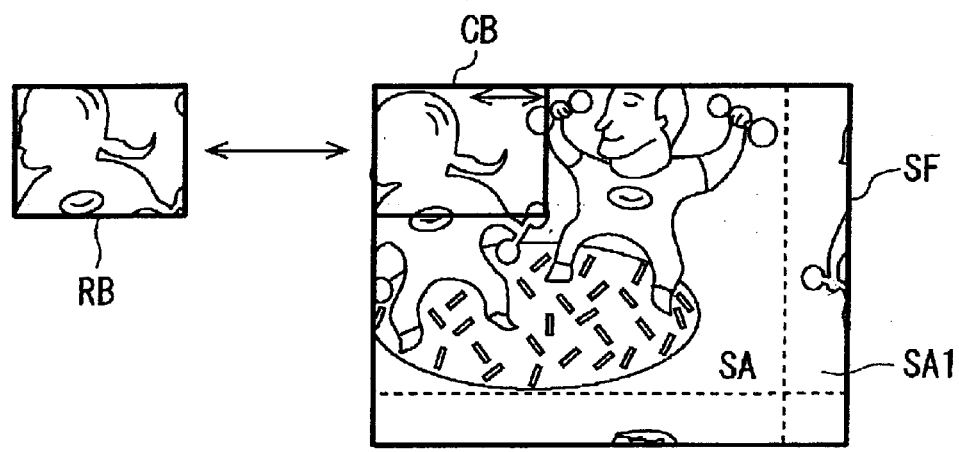
F I G. 16B

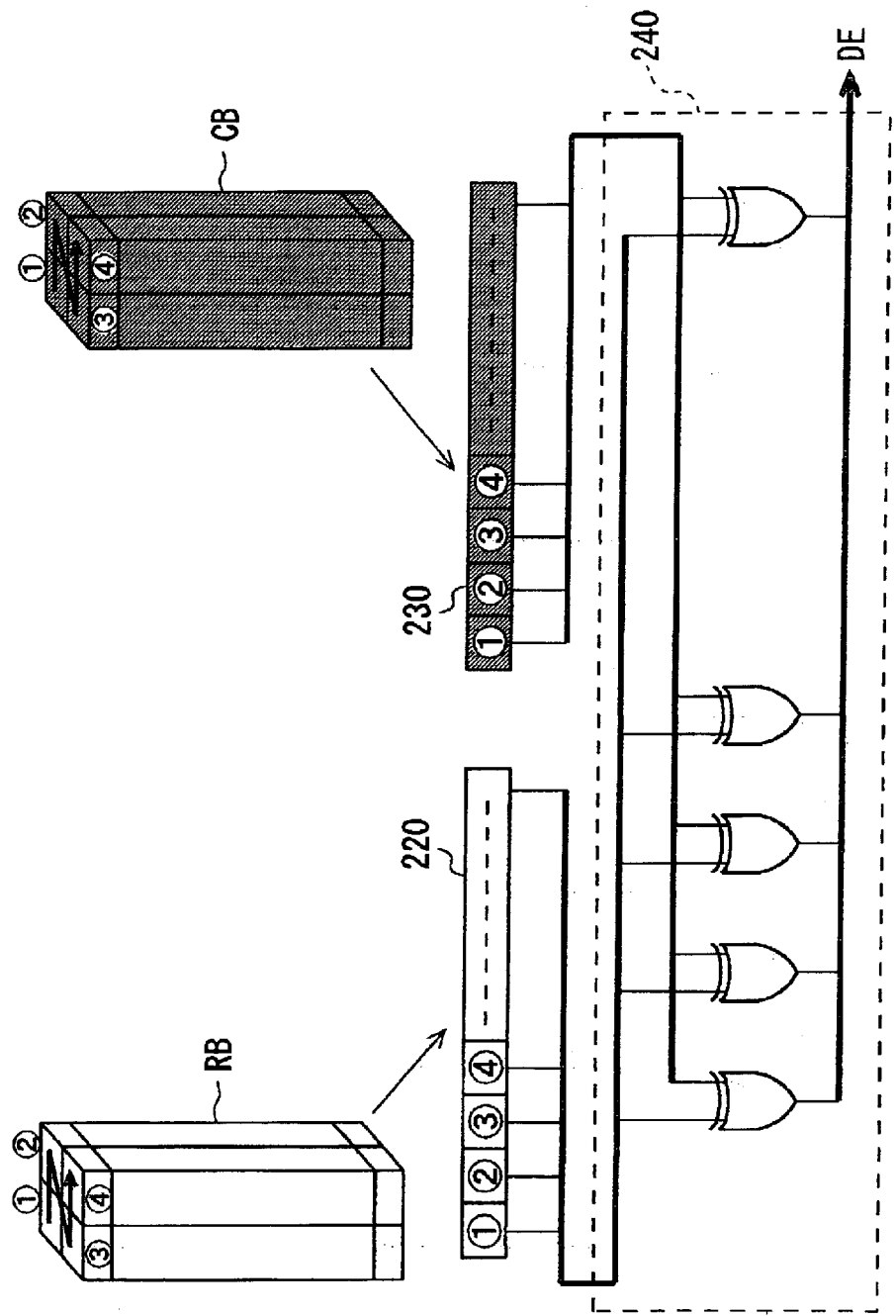

APPARATUS FOR PROCESSING DATA, MEMORY BANK USED THEREFOR, SEMICONDUCTOR DEVICE, AND METHOD FOR READING OUT PIXEL DATA

BACKGROUND OF THE INVENTION

1. Field of the Invention

The present invention relates to a method and system for processing data. More particularly, it relates to an apparatus for processing data, memory bank used therefor, semiconductor device, and method for reading out pixel data.

2. Description of Related Art

As related art, a motion vector composed of both the magnitude and the direction of a motion of an object in the pictures generated at different times has been used to process a moving picture. In a high-performance coding of a picture, the motion vector has been used for the coding for motion compensation and estimation.

Block-matching method has been known as one of the ways to detect the motion vector. According to this method, a candidate block that is most matched with a reference block in a reference frame is found out of the candidate blocks with them being separately set within a predetermine search area, thereby obtaining a motion vector.

FIG. 1 illustrates a case where, if a current target frame is referred as a reference frame RF, a motion vector is directed toward a search frame SF that is preceded by one frame, for example, from the reference frame RF; FIG. 1A shows the reference frame RF as the target frame and FIG. 1B shows the search frame SF.

Pixel data in the reference frame RF is first divided into multiple pixel blocks. Sizes of respective divided pixel blocks are identical to each other. Herein, the size of divided pixel blocks is set to four by four pixels.

One pixel block is selected from the multiple pixel blocks in the reference frame RF as the reference block RB. It will be described how to get a motion vector in reference to the reference block RB.

In pixel data of the search frame SF, a search area SA having a size is set with the middle of the search area being coincident with the reference block RB of the reference frame RF. Pixel blocks each having the same size as that of the reference block RB are set in the search area SA as candidate blocks CB.

By comparing multiple items of pixel data (four by four pixels) forming each candidate block CB within the search area SA of the search frame SF with multiple items of pixel data (four by four pixels) forming the reference block RB of the reference frame RF, absolute difference of pixel data between the corresponding pixels is obtained. This absolute difference of each pixel is summed so that a sum of the absolute difference for each candidate block can be obtained.

Multiple candidate blocks CB exist in the search area SA. The sum of the absolute difference for every candidate block that can be set within the search area SA is calculated. If the search area SA has a size with twelve by twelve pixels, maximum number of the candidate blocks CB that can be set within the search area SA is calculated as 9*9=81. Thus, 81 sums of the absolute difference are calculated for one reference block RB.

In a memory for storing picture data, its address arithmetic portion sequentially calculates the addresses for allowing items of pixel data in relation to the reference block RB and the candidate block CB that is subject to a comparison therewith to be read out. The memory is accessed according to the address thus calculated so that it can read items of the desired pixel data and compare them. Address of each candidate block CB is calculated with a candidate block CB being transferred and set within the search area SA. Thus, the pixel data is entirely read out for each of the candidate blocks CB and the read pixel data is repeatedly compared with that of the reference block RB, thereby obtaining a sum of the absolute difference for each candidate block CB.

Relative location of the candidate block having minimum value of sum of the absolute difference among the sums of the absolute difference thus obtained against the reference block RB is set to a motion vector of the corresponding reference block RB.

According to the block-matching method, pixel data of which the candidate block is composed is always read out of the memory sequentially. Rate of reading data out of a memory is usually slower as compared with operating speed of other logic circuits. An arithmetic processing speed of the block-matching method is limited to memory access speed.

According to the above block-matching method, the memory is accessed with the addresses to which the pixel data of the reference block RB and the pixel data of each of the candidate blocks CB in the search area SA are read being calculated. Thus, complex control of addressing is required. This results in a large size of circuitry.

Thus, an object of the present invention is to provide a data processing apparatus for processing the picture, memory bank used therefor, semiconductor device, and method for reading out pixel data, in order to shorten processing time for obtaining a motion vector.

Another object of the present invention is to provide a data processing apparatus having a simple circuit configuration for processing a picture at a high speed to easily implement data access as a block unit with a limited size of circuitry, by reading desired data out of the memory with picture data being shifted using memory device having a cyclic shift configuration to compare the read data

SUMMARY OF THE INVENTION

According to an aspect of the invention, an apparatus for processing data comprises a first memory bank and a second memory bank.

The first memory bank includes first memory cell array having memory cells arranged in rows and columns, and first word lines arranged in rows. Each of the first word lines extends in a column direction of the first memory cell array. The memory cell alignment in the column direction corresponds to each of the first word lines. The memory cell alignment also stores multiple items of pixel data. The pixel data is derived from each pixel block of a first row. The first row is set in a horizontal way in a search area within a search frame of picture signal.

The first memory bank further includes first sense amplifier for amplifying bit signals of multiple items of pixel data in a predetermined block of pixel. Each bit signal is read out of the first memory cell array corresponding to an activated one of predetermined first word lines.

The first memory bank also includes first data buffer for holding the multiple items of pixel data output from the first sense amplifier. The first memory bank additionally includes first switch for allowing the respective multiple items of pixel data output from the first sense amplifier to be selectively captured into the first data buffer. The first switch is arranged between the first sense amplifier and the first data buffer.

The first memory bank also includes first control circuit for controlling the first switch to allow its switching operation.

The second memory bank includes second memory cell array having memory cells arranged in rows and columns, and second word lines arranged in rows. Each of the second word lines extends in a column direction of the second memory cell array. Each memory cell alignment in the column direction corresponds to each of the second word lines. The memory cell alignment also stores multiple items of pixel data. The pixel data is derived from each pixel block of a second row. The second row is set adjacent to the first row in the horizontal way in the search area within the search frame of the picture signal.

The second memory bank also includes second sense amplifier for amplifying bit signals of multiple items of pixel data in a predetermined pixel block. Each bit signal is read out of the second memory cell array corresponding to an activated one of predetermined second word lines.

The second memory bank further includes second data buffer for holding the multiple items of pixel data output from the second sense amplifier.

The second memory bank additionally includes second switch for allowing the respective multiple items of pixel data output from the second sense amplifier to be selectively captured into the second data buffer. The second switch is arranged between the second sense amplifier and the second data buffer.

The second memory bank also includes second control circuit for controlling the second switch to allow its switching operation.

The second memory bank further includes selector for selecting and extracting multiple items of pixel data as a candidate block from the multiple items of pixel data held in the second data buffer and the multiple items of pixel data held in the first data buffer.

The second memory bank also includes matching circuit for receiving the multiple items of pixel data thus sequentially captured as the candidate block by the selector and input multiple items of pixel data as a reference block in a reference frame of input picture signal, and matching the multiple items of pixel data thus sequentially captured with the input multiple items of pixel data to obtain a motion vector relative to the reference block.

According to the present invention, in the first memory cell array of the first memory bank, the memory cell alignment that is arranged in a column direction of the first memory cell array and corresponds to each of the first word lines arranged in rows and extending in the column direction stores multiple items of pixel data derived from each pixel block of a first row set in a horizontal way in a search area within a search frame of picture signal. For example, the first memory cell array have the memory cells, in the column direction thereof, number of which is enough to allow multiple items of pixel data of one pixel block to be stored.

The multiple items of pixel data of predetermined pixel block, which are read out of this first memory cell array corresponding to an activated one of predetermined first word lines, are selectively captured into the first data buffer through the first sense amplifier and the first switch. The first switch and the first data buffer are illustratively composed of D-type flip-flop circuit.

Various stages exist in this case during a period starting from a situation that multiple items of pixel data of a pixel block in a search area of a search frame are just captured into the first data buffer to a situation that multiple items of pixel data of another pixel block that is horizontally adjacent to the pixel block are just captured into the first data buffer. These stages may be implemented by only the following proceedings of: reading multiple items of pixel data of a pixel block in a search area of a search frame by activating a first word line; capturing the multiple items of pixel data of the pixel block into the first data buffer; then reading multiple items of pixel data of another pixel block that is horizontally adjacent to the pixel block by activating another first word line that is adjacent to the first word line; and sequentially capturing multiple items of pixel data thus read into the first data buffer using the first switch.

Alternatively, in the second memory cell array of the second memory bank, the memory cell alignment that is arranged in a column direction of the second memory cell array and corresponds to each of the second word lines arranged in rows and extending in the column direction of the second memory cell array stores multiple items of pixel data derived from each pixel block of a second row set adjacent to the first row in a horizontal way in the search area within the search frame of the picture signal. Here, the second memory cell array have the memory cells, in a column direction thereof, number of which is enough to allow multiple items of pixel data of one pixel block to be stored.

The multiple items of pixel data of predetermined pixel block, which are read out of this second memory cell array corresponding to an activated one of predetermined second word lines, are selectively captured into the second data buffer through the second sense amplifier and the second switch. The second switch and the second data buffer are illustratively composed of D-type flip-flop circuit.

Various stages exist in this case during a period starting from a situation that multiple items of pixel data of a pixel block in a search area of a search frame are just captured into the second data buffer to a situation that multiple items of pixel data of another pixel block that is horizontally adjacent to the pixel block are just captured into the second data buffer. These stages may be implemented by only the following proceedings of: reading multiple items of pixel data of a pixel block in a search area of a search frame by activating a second word line; capturing the multiple items of pixel data of the pixel block into the second data buffer; then reading multiple items of pixel data of another pixel block that is horizontally adjacent to the pixel block by activating another second word line that is adjacent to the second word line; and sequentially capturing multiple items of pixel data thus read into the second data buffer using the second switch.

In the first memory cell array of the first memory bank, the memory cell alignment corresponding to each of the first word lines stores multiple items of pixel data derived from each pixel block of the first row. On the other hand, in the second memory cell array of the second memory bank, the memory cell alignment corresponding to each of the second word lines stores multiple items of pixel data derived from each pixel block of the second row set adjacent to the first row. Therefore, when reading multiple items of pixel data of a predetermined pixel block out of the second memory cell array of the second memory bank, multiple items of pixel data of a pixel block set vertically adjacent to the predetermined pixel block may be read out of the first second memory bank.

Selector selects and extracts multiple items of pixel data forming a candidate block based on the multiple items of pixel data held in the first data buffer of the first memory bank and the multiple items of pixel data held in the second data buffer of the second memory bank.

If multiple items of pixel data forming a candidate block derive from data of only one pixel block or two pixel blocks that are horizontally adjacent to each other, these multiple items of pixel data forming a candidate block may be extracted using only the multiple items of pixel data held in the first data buffer of the first memory bank or only the multiple items of pixel data held in the second data buffer of the second memory bank.

Alternatively, if multiple items of pixel data forming a candidate block derive from data of two pixel blocks that are vertically adjacent to each other or of four pixel blocks that are vertically and horizontally adjacent to each other, these multiple items of pixel data forming a candidate block may be extracted using the multiple items of pixel data held in the first data buffer of the first memory bank and the multiple items of pixel data held in the second data buffer of the second memory bank.

The matching circuit receives the multiple items of pixel data thus sequentially extracted by the selector as the candidate block and the input multiple items of pixel data as a reference block in a reference frame, and matches the multiple items of pixel data thus sequentially extracted with the input multiple items of pixel data using the block-matching process to obtain a motion vector relative to the reference block.

As described above, in the first and second memory banks, various stages exist during a period starting from a situation that multiple items of pixel data of a pixel block in a search area are just captured into the first or second data buffer to a situation that multiple items of pixel data of another pixel block that is horizontally adjacent to the pixel block are just captured into the first or second data buffer. These stages may be implemented by only the following proceedings of: reading multiple items of pixel data of a pixel block in a search area by activating a first or second word line; capturing the multiple items of pixel data into the first or second data buffer; then reading multiple items of pixel data of another pixel block that is horizontally adjacent to the pixel block by activating another first or second word line that is adjacent to the first or second word line; and sequentially capturing multiple items of pixel data thus read into the first or second data buffer using the first or second switch. This allows the access numbers of time to the memory cell arrays to be limited, thereby shortening processing time for obtaining the motion vector.

According to another aspect of the invention, the memory bank has memory cell array, and a sense amplifier for amplifying bit signals of the multiple items of data, each bit signal being read out of the memory cell array corresponding to the activated one of the predetermined word lines. The memory bank also has data buffer for holding the multiple items of data output from the sense amplifier, and the switch for allowing the respective multiple items of the data output from the sense amplifier to be selectively captured into the data buffer. The switch is arranged between the sense amplifier and the data buffer.

In this aspect of the invention, the multiple items of data read out of the memory cell arrays corresponding to the activated one of the predetermined word lines are selectively captured into the data buffer through the sense amplifier and the switch. The switch and the data buffer are illustratively composed of D-type flip-flop circuit.

In this case, various stages exist during a period starting from a situation that only the multiple items of data read out corresponding to an activated word line area are just captured into the data buffer to a situation that only the multiple items of data read out corresponding to another word line are just captured into the data buffer. These stages may be implemented by only the following proceedings of: reading multiple items of data by activating a word line; capturing the multiple items of data into the data buffer; then reading multiple items of data by activating another word line; and sequentially capturing the multiple items of data thus read into the data buffer using the switch. This allows the access numbers of time to the memory cell arrays to be limited, thereby implementing the above stages for a short time.

According to the present invention, in each of the memory cell arrays, the memory cell alignment that is arranged in a column direction of the memory cell array and corresponds to each of the word lines arranged in rows and extending in the column direction of the memory cell array stores multiple items of pixel data derived from each pixel block of a row set in a horizontal way in a predetermined frame. This allows to be easily implemented various stages existing during a period starting from a situation that only the multiple items of pixel data of a pixel block are just captured into the data buffer to a situation that only the multiple items of pixel data of another pixel block that is horizontally adjacent to the pixel block are just captured into the data buffer.

In accordance with further aspect of the invention, there is a method for reading pixel data out of first memory cell array and second memory cell array. In this method, the first memory cell array has memory cells arranged in rows and columns and word lines arranged in rows. Each of the word lines extends in a column direction of the first memory cell array. The memory cell alignment in the column direction corresponds to each of the first word lines. The memory cell alignment also stores multiple items of pixel data. The pixel data is derived from each pixel block of a first row set in a horizontal way in a predetermined frame of picture signal. The second memory cell array has memory cells arranged in rows and columns, and second word lines arranged in rows, each of the second word lines extending in a column direction of the second memory cell array. The memory cell alignment in the column direction corresponds to each of the second word lines. The memory cell alignment stores multiple items of pixel data. The pixel data is derived from each pixel block of a second row set adjacent to the first row in the horizontal way in the search area within the search frame of the picture signal.

This method comprises the step of reading multiple items of pixel data of a predetermined pixel block out of the first memory cell array by activating a predetermined word line of the memory cell array. This method also comprises the step of reading out of the first memory cell array multiple items of pixel data of a pixel block that is horizontally adjacent to the predetermined pixel block, by activating another word line of the first memory cell array. This word line is horizontally adjacent to the predetermined word line of the first memory cell array. This method further comprises the step of reading out of the second memory cell array multiple items of pixel data of a pixel block that is vertically adjacent to the predetermined pixel block, by activating a word line of the second memory cell array. This word line corresponds to the predetermined word line of the first memory cell array.

This method of the present invention permits multiple items of pixel data of a predetermined pixel block and multiple items of pixel data of other pixel blocks that are horizontally and vertically adjacent to the predetermined pixel block to be rapidly read out.

In accordance with still another aspect of the invention, an apparatus for processing data comprises frame memory for storing data of at least one frame. The data is input on a frame basis. The apparatus also comprises shift memory for holding data of a predetermined search area selected in the frame memory, and shifting the held data one by one.

The apparatus further comprises comparison device for comparing multiple items of data stored in plural memories positioned at predetermined positions in the shift memory with a predetermined data subject to the comparison.

The apparatus additionally comprises data processor for receiving and processing data held on the shift memory with the data shifting to obtain shift information relative to the predetermined positions based on a comparison result by the comparison device when the difference between the multiple items of data stored in the plural memories positioned at the predetermined positions in the shift memory and the predetermined data subject to the comparison is minimum.

According to this aspect of the invention, it is preferable for the shift memory to cyclically shift the data held on the shift memory.

According to this aspect of the invention, it is also preferable for the comparison device to have difference arithmetical operation equipment for performing an arithmetical operation on the multiple items of data stored in the plural memories positioned at the predetermined positions in the shift memory and the predetermined data subject to the comparison to obtain difference value between the multiple items of stored data and the predetermined data subject to the comparison.

According to this aspect of the invention, when the difference value output from the difference arithmetical operation equipment is not more than difference value that has been calculated in last time, the data processor preferably receives the difference value output from the difference arithmetical operation equipment and positional information relative to the predetermined position in the shift memory. The positional information corresponds to the difference value thus received from the difference arithmetical operation equipment. The data processor obtains shift information relative to the predetermined position based on the positional information.

According to this aspect of the invention, the data subject to the comparison preferably comprises multiple items of data stored in predetermined positions in the data of one frame that is delayed in input thereof by one frame after inputting the data stored in the frame memory.

According to this aspect of the invention, the plural memories positioned at the predetermined positions in the shift memory preferably have a data output line for outputting the stored data with the stored data being shifted.

According to this aspect of the invention, it is preferable for the apparatus for processing data to comprise first data holding device for holding the data subject to the comparison, and second data holding device for holding the data stored in the plural memories positioned at the predetermined positions in the shift memory. The data is output from the data out line.

According to this aspect of the invention, it is preferable for the comparison device to have logic circuit for performing the logic operation EXCLUSIVE OR every bit between the data held in the first data holding device and the data held in the second data holding device.

According to this aspect of the invention, the data processor preferably comprises an accumulator for accumulating every bit of data output from the logic circuit for performing the logic operation EXCLUSIVE OR, and a counter for counting shifted number of times in the shift memory. The data processor also comprises first storage device for storing output from the accumulator when the output from the accumulator is not more than the last output thereof. The data processor further comprises second storage device for storing count value from the counter when the output from the accumulator is not more than the last output thereof. The data processor transmits shift information relative to the predetermined position based on the count value stored on the second storage device when a cyclic process of reading every stored data out of the shift memory has been performed.

In accordance with further aspect of the invention, semiconductor device is formed as a semiconductor chip. The device comprises memory for storing data that is input on a predetermined unit basis, and shift memory for holding data of a predetermined search area selected in the memory, and shifting the held data one by one. The device also comprises comparison device for comparing multiple items of data stored in plural memories positioned at predetermined positions in the shift memory with a predetermined data subject to the comparison. The device further comprises data processor for receiving and processing data held on the shift memory with the data shifting to obtain shift information relative to the predetermined positions based on a comparison result by the comparison device when the difference between the multiple items of data stored in the plural memories positioned at predetermined positions in the shift memory and the predetermined data subject to the comparison is minimum.

According to this aspect of the invention, frame memory for storing data and data processor for processing the data thus stored therein are formed as a semiconductor chip. This allows the semiconductor chip to have various functions, thereby implementing the apparatus for processing data with a simple configuration and an excellent performance.

In accordance with still further aspect of the invention, there is a method for processing data. The method comprises storing the data of at least one frame on frame memory. The data is input on a frame basis. The method also comprises selecting a predetermined search area in the frame memory, holding data of the selected search area, and shifting the data held on the shift memory one by one.

The method further comprises comparing multiple items of data stored in the plural memories positioned at predetermined positions in the shift memory with a predetermined data subject to the comparison. The method additionally comprises obtaining shift information relative to the predetermined positions with the data held on the shift memory being shifted according to a comparison result by the comparison device when the difference between the multiple items of data stored in the plural memories positioned at predetermined positions in the shift memory and the predetermined data subject to the comparison is minimum.

According to this aspect of the invention, in relation to data that is input on a frame basis, the data of a predetermined search area is read out of a past one frame and then the data thus read is stored in the shift memory. By subjecting the block-matching method to the data in the search area using data in a reference block of the current reference frame, namely, the data that is subject to the comparison, the positional information in the search area relative to the reference block can be obtained, thereby obtaining a motion vector relative to the reference block based on the positional information.

The block-matching method is carried out by comparing multiple items of data stored as the data of the reference block in plural memories positioned at predetermined positions in the shift memory with the data positioned at a predetermined position in the search area with the data positioned in the search area being shifted one by one. Based on the result of this block-matching processing, a motion vector of the reference block is detected according to the minimum difference value between the data of the reference block and the data positioned at a predetermined position in the search area in addition to the shift information when detecting the minimum difference value. This block-matching method is suitably implemented when all the pixel data in the search area is cyclically shifted. This makes the detection processing of motion vector rapid. Alternatively, the block-matching method avoids addressing during the processing thereof, thereby implementing a simple circuit configuration and a rapid detection of motion vector under low-lord condition.

Pixel data in a reference block of the current reference frame, namely, pixel data that is subject to the comparison, and pixel data of a predetermined search area of the past search frame are subject to the block-matching method.

The concluding portion of this specification particularly points out and directly claims the subject matter of the present invention. However, those skill in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIGS. 7A, 7B and 7C are diagrams for illustrating the writing of data into memory cell arrays in first and second memory banks;

FIG. 15 is a conceptual diagram for illustrating operations of the apparatus for processing data as shown in FIG. 14;

FIGS. 16A and 16B are views illustrating picture signal in motion vector detection processing;

FIG. 17 is circuit diagram for illustrating a comparison circuit, shown in FIG. 14, for comparing every pixel data of candidate block of pixels with that of reference block of pixels.

DESCRIPTION OF THE PREFERRED EMBODIMENT

Preferred embodiments of the present invention will be described more in detail in view of the accompanying drawings.

Figure 1:
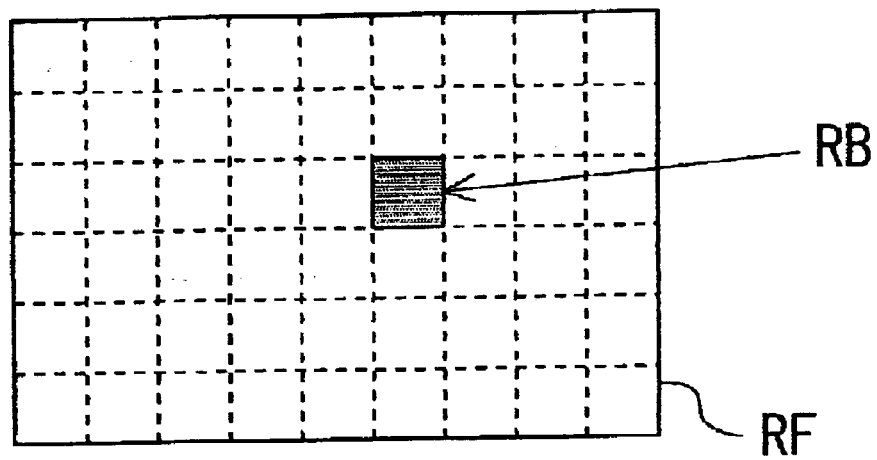
FIGS. 1A and 1B are diagrams for explaining block-matching method for detecting motion.
Figure 1:
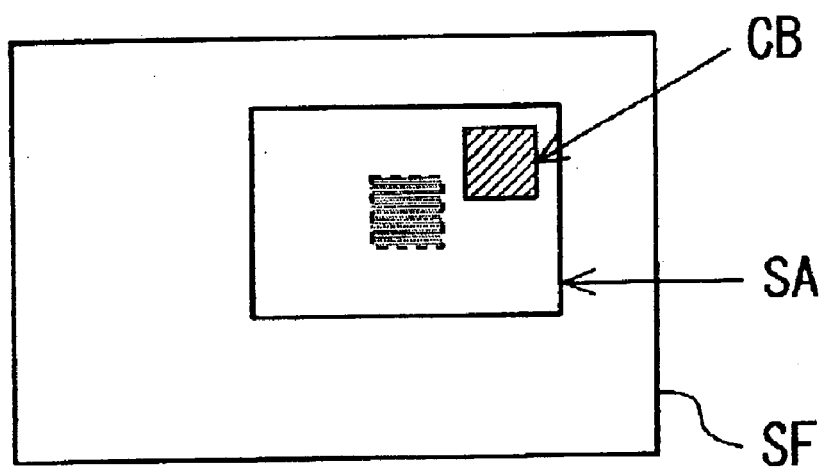
Figure 2:
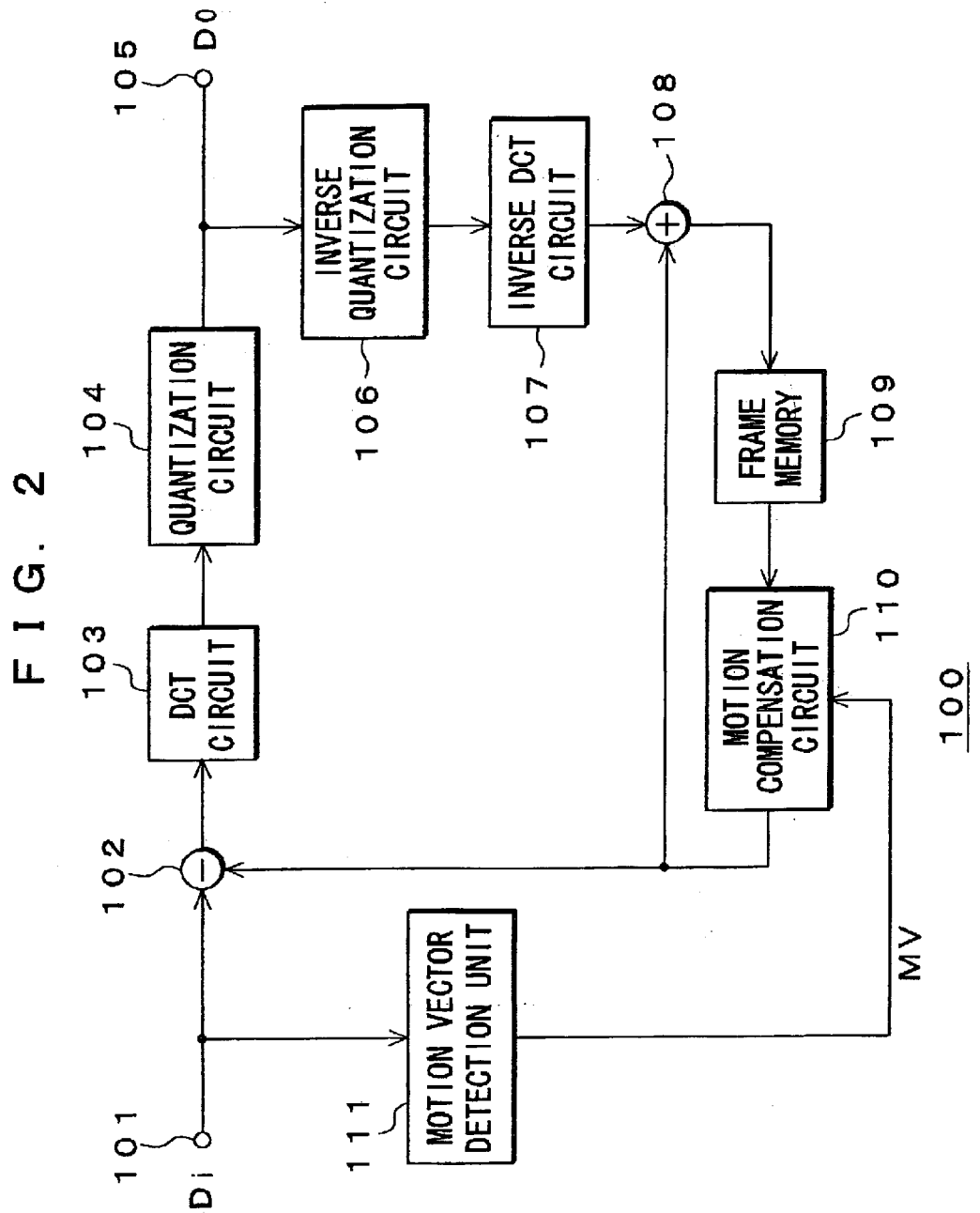
FIG. 2 is a block diagram for illustrating a configuration of a coder for motion compensation and estimation as an embodiment of an apparatus for processing data according to the invention.

FIG. 2 shows a configuration of a coder 100 for motion compensation and estimation as an embodiment of an apparatus for processing data according to the invention.

The coder 100 comprises an input terminal 101 for receiving picture data Di (relative to frame data forming a motion picture), a subtracter 102, a DCT circuit 103, a quantization circuit 104, and an output terminal 105 for transmitting coded data Do. The subtracter 102 receives the picture data Di from the input terminal 101 and then subtracts from this received picture data Di predictive picture data supplied by a motion compensation circuit 110, which will be described later, to obtain a difference between them. The DCT circuit 103 receives difference data from the subtracter 102 and transforms it by the discrete cosine transform (DCT). The quantization circuit 104 receives and quantizes DCT coefficient from the DCT circuit 103 to obtain coded data Do. The output terminal 105 transmits the coded data Do obtained by the quantization circuit 104.

The coder 100 further comprises an inverse quantization circuit 106, an inverse DCT circuit 107, an adder 108, and a frame memory 109. The inverse quantization circuit 106 receives and inverse-quantizes the coded data Do from the quantization circuit 104. The inverse DCT circuit 107 receives output data from the inverse quantization circuit 106 and transforms it by the inverse discrete cosine transform (inverse DCT) to obtain difference data. The adder 108 receives the difference data and the predictive picture data from the inverse DCT circuit 107 and the motion compensation circuit 110, respectively, to add them so that it can reconstitute them as original picture data. The frame memory 109 then stores the reconstituted original picture data.

The coder 100 further comprises the motion compensation circuit 110 and a motion vector detection unit 111. The motion compensation circuit 110 receives the reconstituted original picture data and a motion vector MV of the picture data Di from the frame memory 109 and the motion vector detection unit 111, respectively, to compensate for the reconstituted original picture data with the motion vector MV. The motion compensation circuit 110 then supplies the compensated picture data as the predictive picture data with the subtracter 102 and the adder 108. The motion vector detection unit 111 receives the picture data Di from the input terminal 101 and detects its motion vector MV. The motion vector detection unit 111 then supplies the motion vector MV with the motion compensation circuit 110.

Operations of the coder 100 shown in FIG. 2 will be described.

The picture data Di received from the input terminal 101 is supplied with the subtracter 102 and the motion vector detection unit 111. The subtracter 102 subtracts from the picture data Di the predictive picture data supplied by the motion compensation circuit 110 to obtain a difference between them.

Difference data obtained by the subtracter 102 is supplied with the DCT circuit 103 that transforms it by the discrete cosine transform (DCT). DCT coefficient obtained by the DCT circuit 103 is supplied with the quantization circuit 104 that quantizes it to obtain coded data Do. The coded data Do is transmitted through the output terminal 105.

The coded data Do obtained by the quantization circuit 104 is also supplied with the inverse quantization circuit 106 that inverse-quantizes it. The inverse DCT circuit 107 receives output data from the inverse quantization circuit 106 and transforms it by the inverse discrete cosine transform (inverse DCT) to reconstitute the difference data. The reconstituted difference data and the predictive picture data from the motion compensation circuit 110 are added to each other in the adder 108 so that the original picture data can be reconstituted. The frame memory 109 then stores the reconstituted original picture data.

In motion compensation circuit 110, the original picture data stored in the frame memory 109 at the last frame is read out of the frame memory 109 at a current frame. The picture data thus read is subject to the motion compensation based on the motion vector from the motion vector detection unit 111, thereby obtaining the predictive picture data. This predictive picture data is supplied with the subtracter 102 that obtains the difference data and with the adder 108 that performs the reconstitution as the original picture data.

Next, a constitution of the motion vector detection unit 111 will be described more in detail.

Figure 3:
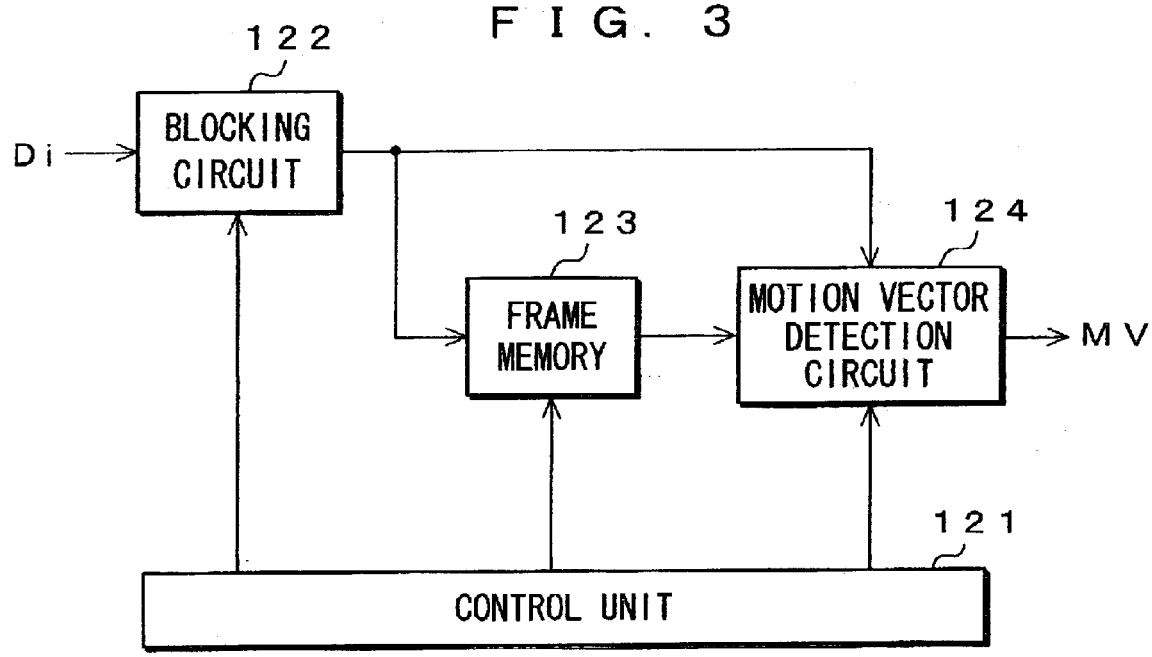
FIG. 3 is a block diagram for illustrating a configuration of motion vector detection unit shown in FIG. 2.

The motion vector detection unit 111 detects the motion vector MV according to the block-matching process. FIG. 3 shows a constitution of an example of the motion vector detection unit 111.

This motion vector detection unit 111 comprises control unit 121 for controlling operations of the entire detection unit 111, and a blocking circuit 122 for sequentially blocking the input picture data Di of the reference frame in a predetermined size, for this embodiment, a size of four pixels by four pixels.

The motion vector detection unit 111 further comprises a frame memory 123 and a motion vector detection circuit 124. The frame memory 123 receives and stores multiple items of pixel data of the pixel blocks that are sequentially output from the blocking circuit 122 to allow the detection unit 111 to use them as the pixel data of a search frame at the next frame. The motion vector detection circuit 124 receives the multiple items of pixel data of the pixel blocks that are sequentially output from the blocking circuit 122 as the pixel data of reference blocks, and the multiple items of pixel data read as the pixel data of a search frame out of the frame memory 123 corresponding to each of the reference blocks, thereby obtaining the motion vector MV relative to each reference block.

Operations of the motion vector detection unit 111 shown in FIG. 3 will be described.

The input picture data Di of the reference block is supplied with the blocking circuit 122. In this blocking circuit 122, the picture data Di is subject to blocking process one by one in a size of four pixels by four pixels.

The multiple items of pixel data of the pixel blocks that are sequentially output from the blocking circuit 122 are supplied with the frame memory 123 that stores the multiple items of pixel data for using them as the pixel data of the search frame at the next frame.

The multiple items of pixel data of the pixel blocks that are sequentially output from the blocking circuit 122 are also supplied as the pixel data of reference blocks with the motion vector detection circuit 124. The detection circuit 124 also receives the multiple items of pixel data as the pixel data of a search frame, from the frame memory 123, corresponding to each of the multiple items of pixel data of the reference blocks with the multiple items of pixel data of the reference blocks being input. In the motion vector detection circuit 124, both of the multiple items of pixel data are subject to the block-matching process every reference block, thereby obtaining the motion vector MV relative to each reference block.

Figure 4:
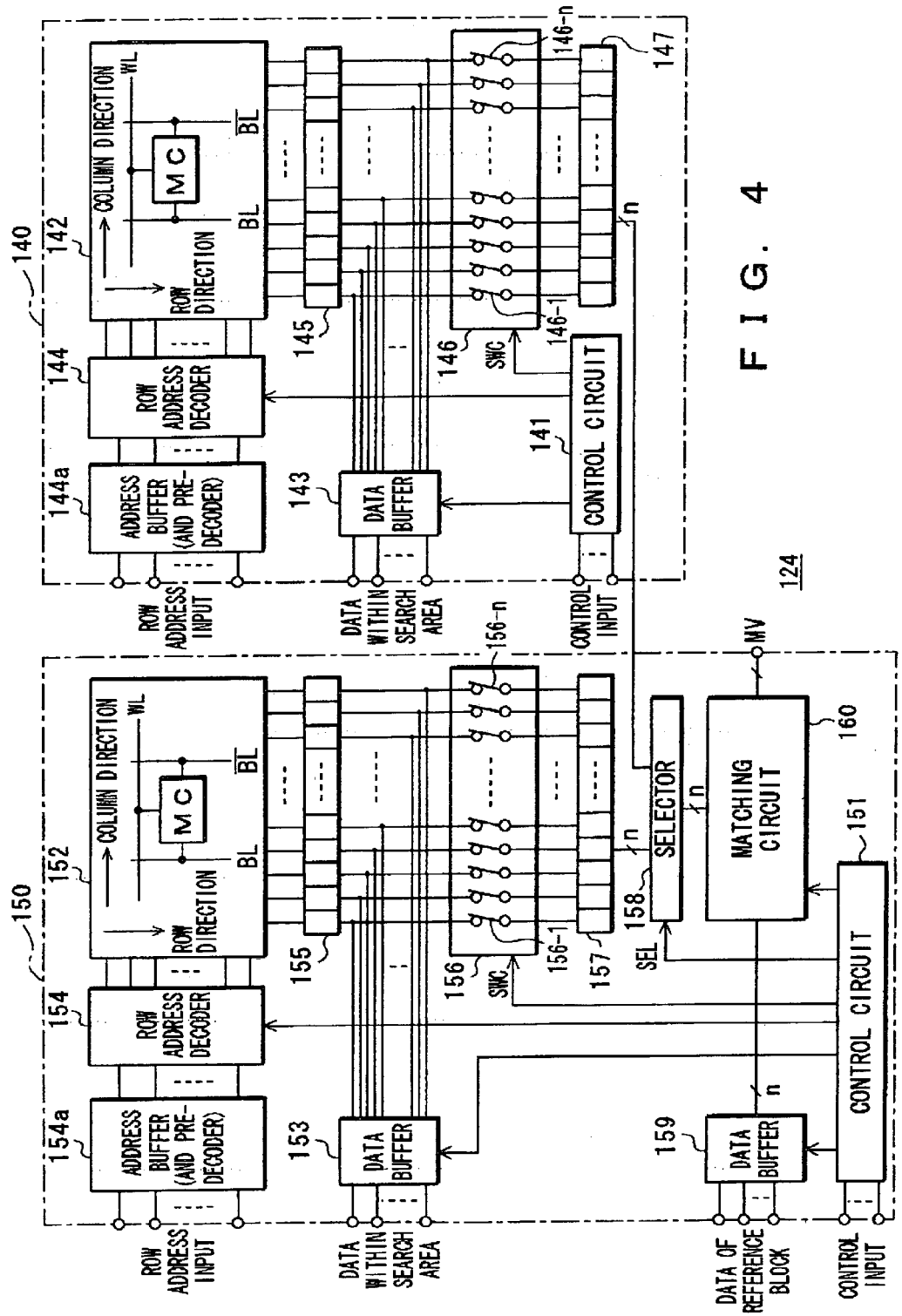
FIG. 4 is a block diagram for illustrating a configuration of motion vector detection circuit shown in FIG. 3.

Next, a constitution of the motion vector detection circuit 124 will be described more in detail. FIG. 4 shows a constitution of the motion vector detection circuit 124.

This motion vector detection circuit 124 is composed of first memory bank 140 and second memory bank 150.

The first memory bank 140 will be first described. The first memory bank 140 comprises a control circuit 141, a memory cell array 142, a data buffer 143 for receiving and storing data, and a row address decoder 144. The control circuit 141 controls operations of the circuits in the bank 140 based on control inputs. The memory cell array 142 includes memory cells arranged as a matrix in rows and columns.

Figure 5:
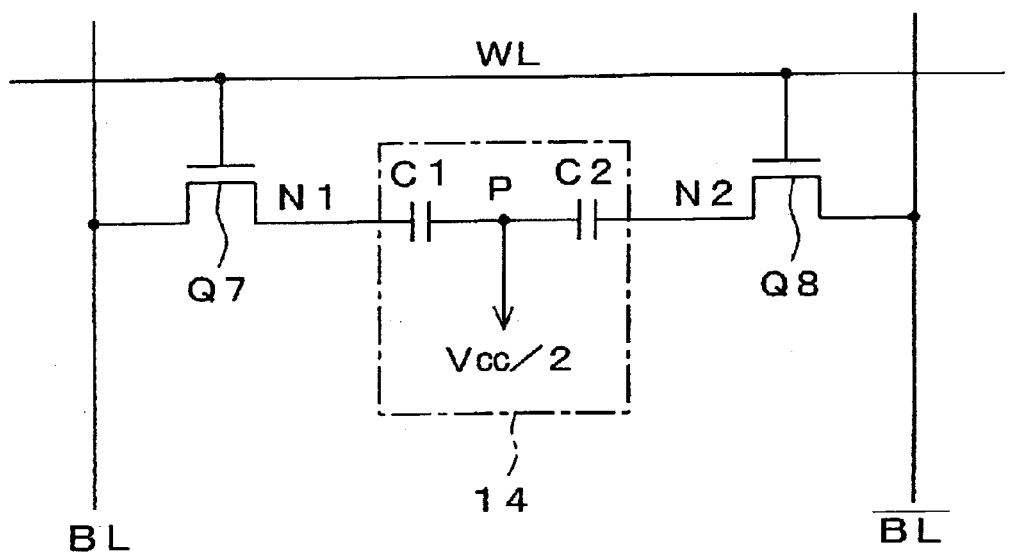
FIG. 5 is a diagram for illustrating a configuration of DRAM cell.

Each of the memory cells MC forming the memory cell array 142 is composed of semiconductor cell such as a DRAM cell. FIG. 5 shows an illustrative configuration of the DRAM cell.

Capacitors C1 and C2 are connected in series. A voltage Vcc/2 is applied to middle point between them where Vcc is referred to as a source voltage. Storage node N1 set at a side of the capacitor C1 contrary to the middle point is connected with bit line BL via access transistor Q7, gate of which is connected with word line WL. Storage node N2 set at a side of the capacitor C2 contrary to the middle point is connected with bit line BL' via access transistor Q8, gate of which is connected with word line WL (a word, "BL" indicates a negation of "BL").

In this DRAM cell, The memory cell part 14 composed of a pair of capacitors C1 and C2 stores data in a form of "0" or "1". Data transfer between the memory cell part 14 and the bit line BL or BL' through the access transistor Q7 or Q8 is carried out when writing or reading the data.

Referring back to FIG. 4, in the memory cell array 142, an alignment of memory cells MC arranged in a column direction of memory cell array 142 stores multiple items of pixel data. The alignment of the memory cells MC corresponds to each of the word lines that are arranged in rows and extend in the column direction of the memory cell array 142. The stored pixel data is derived from each pixel block of a first row set in a horizontal way in a search area within a search frame of picture signal.

According to the embodiment of the invention, the search area is set so that it can be formed as three pixel blocks by three pixel blocks as the middle of the pixel block corresponding to the reference block. Alignments of the memory cells MC corresponding to each of the three serial word lines in the memory cell array 142 respectively store multiple items of pixel data of three pixel blocks in a second row set in a horizontal way in the search area.

Thus, in the invention, each alignment of the memory cells MC corresponding to each of the word lines in the cell array 142 stores multiple items of pixel data of one pixel block. According to the embodiment, each alignment of the memory cells MC has the memory cells, numbers of which are enough to allow multiple items of pixel data of one pixel block to be stored therein, in the column direction of the memory cell array 142.

The multiple items of pixel data of the pixel block in the search area to be stored in each alignment of the memory cells MC corresponding to each of the word lines in the memory cell array 142 are read out of the above frame memory 123 (see FIG. 3) and held on the data buffer 143 temporarily. After all the multiple items of pixel data of one pixel block has been stored in the data buffer 143, each of the bit signals forming the multiple items of pixel data of one pixel block is supplied with bit line BL or BL' of the memory cell array 142 via a sense amplifier, which will be described later.

In this condition, when a predetermined word line of the memory cell array 142 is activated, an alignment of the memory cells MC corresponding to the predetermined word line concurrently stores the multiple items of pixel data of one pixel block. This allows the pixel data to be written into the memory cell array 142 on a pixel block unit basis, thereby implementing the effective writing of pixel data.

The row address decoder 144 receives row address through the address buffer 144a. The row address decoder 144 activates each of the predetermined word lines of the memory cell array 142 corresponding to the row addresses supplied through the address buffer 144a. This allows the alignment of the memory cells MC corresponding to each of the predetermined word lines to store and read the data.

The first memory bank 140 further comprises a sense amplifier 145, a switch 146, and a data buffer 147. The sense amplifier 145 amplifies bit signals of the multiple items of pixel data that are read out of the memory cell array 142 corresponding to an activated one of the predetermined word lines. The data buffer 147 holds the multiple items of pixel data output from the sense amplifier 145. The switch 146 is arranged between the sense amplifier 145 and the data buffer 147. The switch 146 allows the respective multiple items of pixel data output from the sense amplifier 145 to be selectively captured into the data buffer 147.

Assume that a total number of bit signals forming the multiple items of pixel data of one pixel block to be read out of the memory cell array 142 corresponding to an activated one of the predetermined word line is n. The sense amplifier 145 is composed of n pieces of amplifier parts. The switch 146 is also composed of n pieces of switch parts 146-1 through 146-n. The data buffer 147 is composed of n pieces of storage devices.

When the multiple items of the pixel data of a predetermined pixel block are read out of the memory cell array 142 corresponding to the activated one of the predetermined word lines, the bit signals of this multiple items of pixel data are amplified and output from the sense amplifier 145. In this situation, when any of the predetermined switch parts of the switch 146 turns on, bit signals output from the amplifier parts of sense amplifier 145 corresponding to the predetermined switch parts may be captured into the storage devices of data buffer 147 that correspond to the predetermined switch parts.

Various stages existing during a period starting from a situation that only multiple items of pixel data of a pixel block are just captured into the data buffer 147 to a situation that only multiple items of pixel data of another pixel block that is horizontally adjacent to the pixel block are just captured into the data buffer 147 are implemented by merely accessing the memory cell array 142 by two times as follows:

Multiple items of pixel data of a pixel block are first read by activating a word line; The multiple items of pixel data thus read are then captured into the data buffer 147 through the sense amplifier 145 and the switch 146; Next, multiple items of pixel data of another pixel block that is horizontally adjacent to the pixel block are read by activating another word line that is adjacent to the word line and then the multiple items of pixel data thus read are output from the sense amplifier 145; and in this situation, when any of the predetermined switch parts 146-1 through 146-n of the switch 146 selectively turns on, the multiple items of pixel data output from the sense amplifier 145 are sequentially captured into the data buffer 147.

Figure 6:
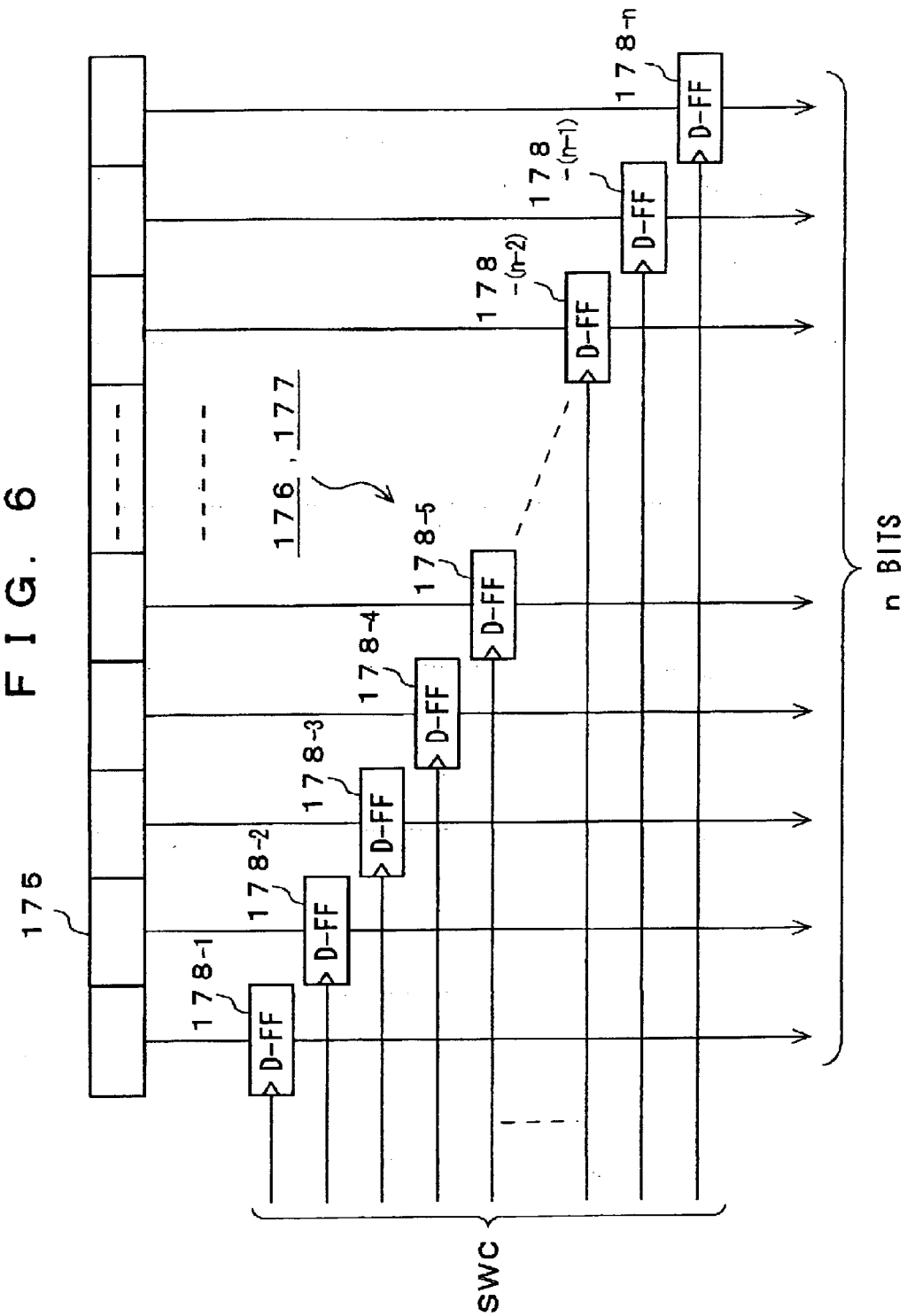
FIG. 6 is a diagram for illustrating an actual system of switch and data buffer.

The switch 146 and the data buffer 147 are illustratively composed of D-type flip-flop circuits 178-1 through 178-n shown in FIG. 6. The control circuit 141 supplies switching control signals SWC with a clock terminal of each of the D-type flip-flop circuits 178-1 through 178-n.

Further, the second memory bank 150 will be described. The second memory bank 150 comprises a control circuit 151, a memory cell array 152, a data buffer 153 for receiving and storing data, and a row address decoder 154. The control circuit 151 controls operations of the circuits in the bank 150 based on control inputs. The memory cell array 152 includes memory cells arranged as a matrix in rows and columns.

Each of the memory cells MC forming the memory cell array 152 is composed of semiconductor cell such as a DRAM cell, similar to the above memory cells MC forming the memory cell array 142 in the first memory bank 140.

In the memory cell array 152, an alignment of memory cells MC arranged in a column direction of the memory cell array 152 also stores multiple items of pixel data. The alignment of the memory cells MC corresponds to each of the word lines that are arranged in rows and extend in the column direction of the memory cell array 152. The stored pixel data is derived from each pixel block of a second row set in a horizontal way in a search area within a search frame of picture signal. The respective pixel blocks of the second row are adjacent to those of the first row, which has been described in the description on the memory cell array 142 of the first memory bank 140.

According to the embodiment of the invention, the search area is set so that it can be formed as three pixel blocks by three pixel blocks as the middle of the pixel block corresponding to the reference block, as described above. In this case, alignments of the memory cells MC corresponding to each of the three serial word lines in the memory cell array 152 respectively store multiple items of pixel data of three pixel blocks in a first or third row set in a horizontal way in the search area.

Thus, according to the invention, the multiple items of pixel data of three pixel blocks that are horizontally arranged in the first row are first stored in the memory cell array 152 of the second memory bank 150. Similarly, the multiple items of pixel data of three pixel blocks that are horizontally arranged in the second row are stored in the memory cell array 142 of the first memory bank 140. Thus, candidate blocks each comprising the multiple items of pixel data of six pixel blocks arranged in the first and second rows, which are stored in the first and second memory cell arrays 142, 152, are sequentially generated.

Next, the multiple items of pixel data of three pixel blocks that are horizontally arranged in the third row are stored in the memory cell array 152 of the second memory bank 150. Other candidate blocks each comprising the multiple items of pixel data of six pixel blocks arranged in the second and third rows, which are stored in the first and second memory cell arrays 142, 152, are sequentially generated. Thus, all the candidate blocks in the search area of the search frame are sequentially generated.

As described above, each alignment of the memory cells MC corresponding to each of the word lines in the memory cell array 152 stores multiple items of pixel data of one pixel block. According to the embodiment, each alignment of the memory cells MC has the memory cells, numbers of which are enough to allow multiple items of pixel data of one pixel block to be stored therein, in the column direction of the memory cell array 152, similar to the memory cell array 142 of the first memory bank 140.

The multiple items of pixel data of the pixel block in the search area to be stored in each alignment of the memory cells MC corresponding to each of the word lines in the memory cell array 152 are read out of the above frame memory 123 (see FIG. 3) and held on the data buffer 153 temporarily. After all the multiple items of pixel data of one pixel block has been stored in the data buffer 153, each of the bit signals forming the multiple items of pixel data of one pixel block is supplied with bit line BL or BL' of the memory cell array 152 via a sense amplifier, which will be described later.

In this condition, when any one of the predetermined word lines of the memory cell array 152 is activated, alignment of the memory cells MC corresponding to the predetermined word line concurrently stores the multiple items of pixel data of one pixel block. This allows the pixel data to be written into the memory cell array 152 on a pixel block unit basis, thereby implementing the effective writing of pixel data.

The row address decoder 154 receives row addresses through the address buffer 154a. The row address decoder 154 activates each of the predetermined word lines of the memory cell array 152 corresponding to the row addresses supplied through the address buffer 154a. This allows alignments of the memory cells MC corresponding to the predetermined word lines to store and read data.

The memory cell array 152 further comprises a sense amplifier 155, a switch 156, and a data buffer 157. The sense amplifier 155 amplifies bit signals of the multiple items of pixel data that are read out of the memory cell array 152 corresponding to the activated predetermined word line. The data buffer 157 holds the multiple items of pixel data output from the sense amplifier 155. The switch 156 is arranged between the sense amplifier 155 and the data buffer 157. The switch 156 allows the respective multiple items of pixel data output from the sense amplifier 155 to be selectively captured into the data buffer 157.

Assume that a total number of bit signals forming the multiple items of pixel data of one pixel block to be read out of the memory cell array 152 corresponding to an activated one of the predetermined word line is n. The sense amplifier 155 is composed of n pieces of amplifier parts. The switch 156 is also composed of n pieces of switch parts 156-1 through 156-n. The data buffer 157 is composed of n pieces of storage devices.

When the multiple items of the pixel data of a predetermined pixel block are read out of the memory cell array 152 corresponding to the activated one of the predetermined word lines, the bit signals of this multiple items of pixel data are amplified and output from the sense amplifier 155. In this situation, when any of the predetermined switch parts of the switch 156 turns on, bit signals output from the amplifier parts of sense amplifier 155 corresponding to the predetermined switch parts may be captured into the storage devices of data buffer 157 that correspond to the predetermined switch parts.

Various stages existing during a period starting from a situation that only multiple items of pixel data of a pixel block are just captured into the data buffer 157 to a situation that only multiple items of pixel data of another pixel block that is horizontally adjacent to the pixel block are just captured into the data buffer 157 are implemented by merely accessing the memory cell array 152 by two times as follows:

Multiple items of pixel data of a pixel block are first read by activating a word line; The multiple items of pixel data thus read are then captured into the data buffer 157 through the sense amplifier 155 and the switch 156; Next, multiple items of pixel data of another pixel block that is horizontally adjacent to the pixel block are read by activating another word line that is adjacent to the word line and then the multiple items of pixel data thus read are output from the sense amplifier 155; and in this situation, when any of the predetermined switch parts 156-1 through 156-n of the switch 156 selectively turns on, the multiple items of pixel data output from the sense amplifier 155 are sequentially captured into the data buffer 157.

The switch 156 and the data buffer 157 are illustratively composed of D-type flip-flop circuits, similar to the switch 146 and the data buffer 147 of the first memory bank 140 (see FIG. 6).

The second memory bank 150 further comprises a selector 158 for selecting and extracting multiple items of pixel data adapted to be formed as a candidate block from the multiple items of pixel data held in the data buffer 157 and the multiple items of pixel data held in the data buffer 147 of the first memory bank 140. The control circuit 151 supplies the selective control signal SEL with this selector 158.

If multiple items of pixel data adapted to be formed as a candidate block derive from pixel data of only one pixel block or of two pixel blocks that are horizontally adjacent to each other, these multiple items of pixel data adapted to be formed as the candidate block may be extracted using only the multiple items of pixel data held in the data buffer 147 of the first memory bank 140 or only the multiple items of pixel data held in the data buffer 157 of the second memory bank 150.

Alternatively, if multiple items of pixel data adapted to be formed as a candidate block derive from pixel data of two pixel blocks that are vertically adjacent to each other or of four pixel blocks that are vertically and horizontally adjacent to each other, these multiple items of pixel data adapted to be formed as the candidate block may be extracted using the multiple items of pixel data held in the data buffer 147 of the first memory bank 140 and the multiple items of pixel data held in the data buffer 157 of the second memory bank 150.

The second memory bank 150 further comprises data buffer 159 for receiving the pixel data relative to the reference blocks. The data buffer 159 temporarily stores the multiple items of pixel data of the respective pixel blocks that are sequentially output from the blocking circuit 122 (see FIG. 3), as the multiple items of pixel data of each of the reference blocks.

The first memory bank 150 also comprises a matching circuit 160. This matching circuit 160 receives the multiple items of pixel data adapted to be formed as the predetermined reference block from the data buffer 159 and the multiple items of pixel data of a predetermined number of the candidate blocks, in this embodiment, 81 blocks, thus sequentially captured as the candidate blocks by the selector 158 corresponding to this reference block. The matching circuit 160 then matches the multiple items of pixel data thus sequentially captured as the candidate blocks with the input multiple items of pixel data as the predetermined reference block according to the block-matching process to obtain a motion vector MV relative to the predetermined reference block.

In order to obtain the motion vector MV, comparing the multiple items of pixel data (four pixels by four pixels in this embodiment) forming the reference block and the multiple items of pixel data (four pixels by four pixels in this embodiment) forming the candidate block allows the absolute difference values of the pixel data relative to the respective corresponding positions to be obtained. The absolute difference values are summed so that a sum of the absolute difference values for each candidate block can be obtained. Sums of the absolute difference values are calculated for all 81 candidate blocks. The relative position of the candidate block against the reference block indicating the minimum value among the sums of the absolute difference values is set as motion vector MV relative to the corresponding reference block.

Operations of the motion vector detection circuit 124 shown in FIG. 4 will be described. Particularly, a case where a motion vector MV of a targeted one of the predetermined reference blocks (hereinafter referred to as "targeted reference block") is obtained will be described.

In this case, as shown in FIG. 7A, the search area SA of the search frame SF is set so that it can be formed as being three blocks by three blocks in a middle of a pixel block that corresponds to the targeted reference block.

In the memory cell array 152 of the second memory bank 150, first through third pixel blocks (PB1–PB3) horizontally arranged in a first row thereof store the multiple items of pixel data.

The multiple items of pixel data of the pixel block PB1 are read out of the frame memory 123 and temporarily stored in the data buffer 153. The bit signals forming multiple items of pixel data of the pixel block PB1 are supplied with the bit line BL or BL' of the memory cell array 152 through the sense amplifier 155. When word line WLi of the memory cell array 152 is activated in this situation, a alignment of memory cells MC corresponding to this word line WLi of the memory cell array 152 concurrently stores the multiple items of pixel data of the pixel block PB1. Similarly, each of the alignments of the memory cells MC corresponding to the respective word lines, WLi+1 and WLi+2, of the memory cell array 152 concurrently stores the multiple items of pixel data relative to each of the pixel blocks PB2 and PB3 (see FIG. 7B).

Alternatively, in the memory cell array 142 of the first memory bank 140, first through third pixel blocks (PB4–PB6) horizontally arranged in a second row thereof store the multiple items of pixel data.

The multiple items of pixel data relative to the pixel block PB4 are read out of the frame memory 123 (see FIG. 3) and temporarily stored in the data buffer 143. The bit signals forming the multiple items of pixel data of the pixel block PB4 are supplied with the bit line BL or BL' of the memory cell array 142 through the sense amplifier 145. When word line WLi of the memory cell array 142 is activated in this situation, an alignment of the memory cells MC corresponding to this word line WLi of the memory cell array 142 concurrently stores the multiple items of pixel data of the pixel block PB4. Similarly, each of the alignments of the memory cells MC corresponding to the respective word lines, WLi+1 and WLi+2, of the memory cell array 142 concurrently stores the multiple items of pixel data of each of the pixel blocks PB5 and PB6 (see FIG. 7C).

Figure 8A:
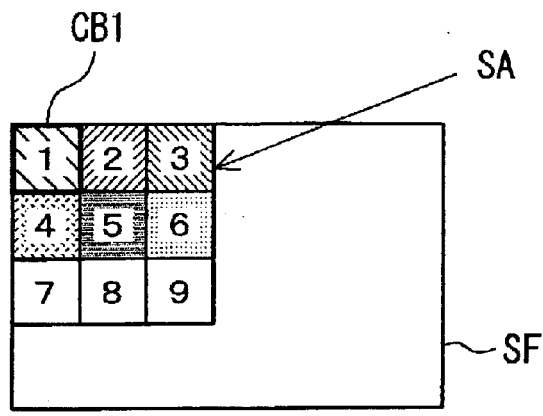
FIGS. 8A and 8B are diagrams for illustrating a series of the operations for generating a candidate block.
Figure 8B:
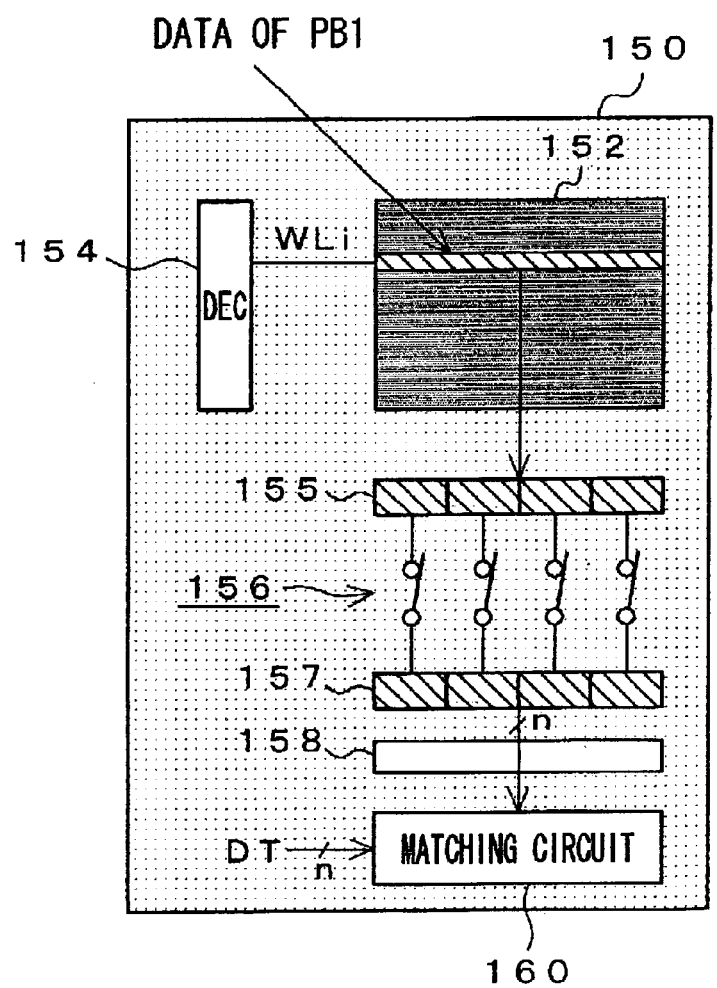

Next, while the memory cell arrays 142 and 152 store the pixel data of six pixel blocks, an activation of the word line WLi of the second memory cell array 152 allows the multiple items of pixel data of the pixel block PB1 stored in the alignment of the memory cells MC corresponding to the word line WLi to be concurrently read out, as shown in FIG. 8B.

The sense amplifier 155 amplifies and outputs bit signals relative to the multiple items of pixel data of the pixel block PB1. When all the switch parts of the switch 156 then turn on in this situation, all the multiple items of pixel data of the pixel block PB1 thus output from the sense amplifier 155 are captured into the data buffer 157.

The selector 158 selects the multiple items of pixel data of the pixel block PB1 thus stored in the data buffer 157 as the multiple items of pixel data of the candidate block CB1 in the search area SA, as shown in FIG. 8A, to supply them with the matching circuit 160.

The matching circuit 160 receives the multiple items of pixel data DT relative to the targeted reference block through the data buffer 159. The matching circuit 160 compares the multiple items of pixel data (four pixels by four pixels) forming the targeted reference block and the multiple items of pixel data (four pixels by four pixels) forming the candidate block to allow the absolute difference values of the pixel data relative to the corresponding position to be obtained. The absolute difference values are then summed so that a sum of the absolute difference values for each candidate block CB1 can be obtained.

Figure 9A:
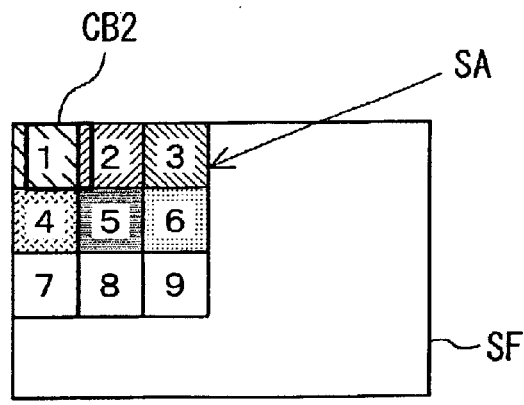
FIGS. 9A and 9B are diagrams for illustrating a series of the operations for generating a candidate block.
Figure 9B:
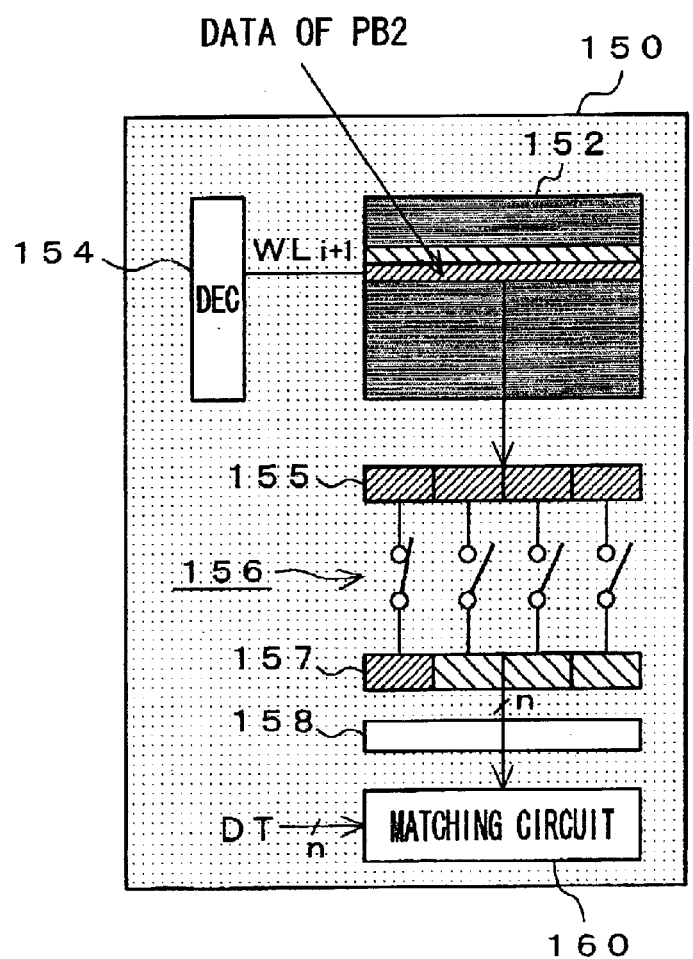

Next, when the word line WLi+1 of the second memory cell array 152 is activated, the multiple items of pixel data of the pixel block PB2 stored in an alignment of the memory cells MC corresponding to the word line WLi+1 are concurrently read out, as shown in FIG. 9B.

The sense amplifier 155 amplifies and outputs bit signals relative to the multiple items of pixel data of the pixel block PB2. In this situation, of switch parts of the switch 156, every switch part which corresponds to four pixels of a first column of the pixel block PB2 starting from the leftmost thereof, turns on. Thus, the pixel data relative to four pixels of a first column of the pixel block PB2 starting from the leftmost thereof, which have been output from the sense amplifier 155, is newly captured into the data buffer 157.

The pixel data of one pixel block that is just stored in the data buffer 157 is set to the multiple items of pixel data forming the candidate block CB2 that is shifted on a right way by one pixel relative to the candidate block CB1.

The selector 158 selects the multiple items of pixel data forming the candidate block CB2 to supply them with the matching circuit 160. The matching circuit 160 then obtains a sum of the absolute difference values for the candidate block CB2 similar to a case of the above candidate block CB1.

Further, of switch parts of the switch 156, every switch part which corresponds to four pixels of a second column of the pixel block PB2 starting from the leftmost thereof, turns on.

Figure 10A:
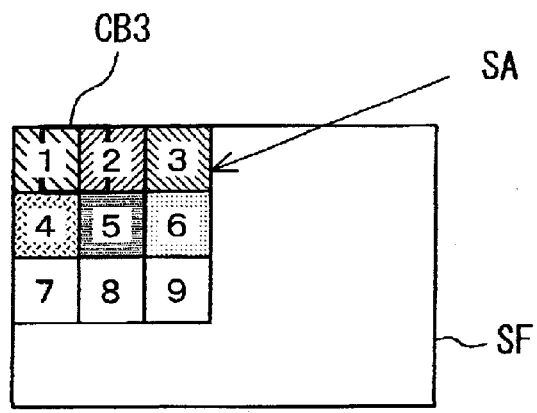
FIGS. 10A and 10B are diagrams for illustrating a series of the operations for generating a candidate block.
Figure 10B:
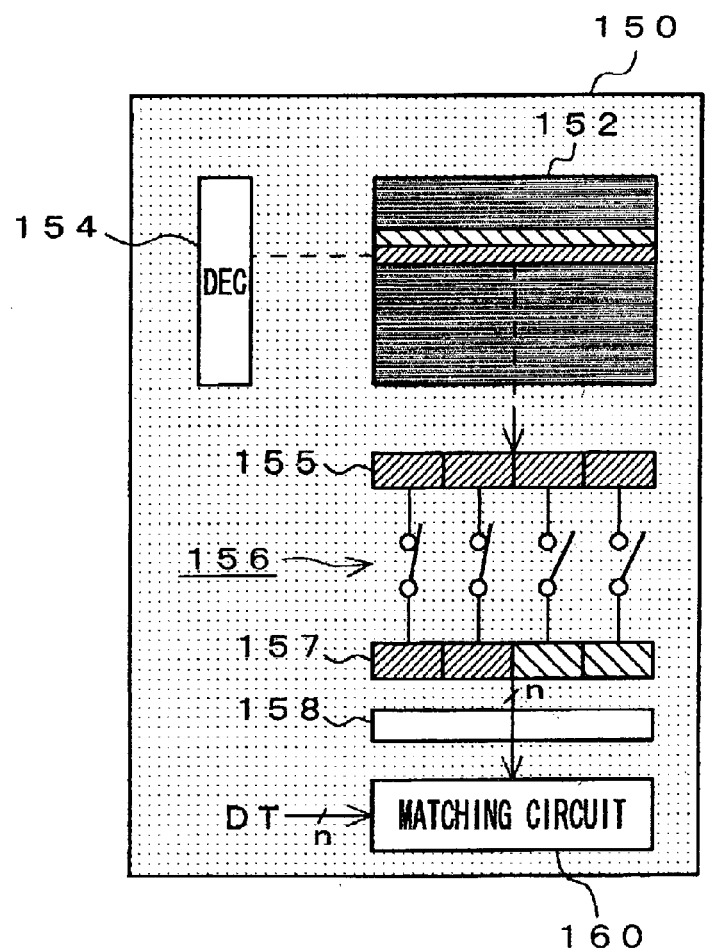

Thus, the pixel data relative to four pixels of the second column of the pixel block PB2 starting from the left end thereof, which have been output from the sense amplifier 155, is newly captured into the data buffer 157, as shown in FIG. 10B.

The pixel data of one pixel block that is just stored in the data buffer 157 is set to the multiple items of pixel data forming the candidate block CB3 that is shifted on a right way by two pixels relative to the candidate block CB1, as shown in FIG. 10A.

The selector 158 selects the multiple items of pixel data forming the candidate block CB3 to supply them with the matching circuit 160. The matching circuit 160 then obtains a sum of the absolute difference values for the candidate block CB3 similar to a case of the above candidate block CB1.

Additionally, of switch parts of the switch 156, every switch part which corresponds to four pixels of a third column of the pixel block PB2 starting from the leftmost thereof, turns on.

Thus, the pixel data relative to the four pixels of the third column of the pixel block PB2 starting from the leftmost thereof, which have been output from the sense amplifier 155, is newly captured on the data buffer 157.

The pixel data of one pixel block that is just stored in the data buffer 157 is set to the multiple items of pixel data forming the candidate block CB4 (not shown) that is shifted in a right direction by three pixels relative to the candidate block CB1.

The selector 158 selects the multiple items of pixel data forming the candidate block CB4 to supply them with the matching circuit 160. The matching circuit 160 then obtains a sum of the absolute difference values for the candidate block CB4 similar to a case of the above candidate block CB1.

Next, of switch parts of the switch 156, every switch part which corresponds to four pixels of a fourth column of the pixel block PB2 starting from the leftmost thereof, turns on.

Thus, the pixel data relative to four pixels of the fourth column of the pixel block PB2 starting from the left end thereof, which have been output from the sense amplifier 155, is newly captured on the data buffer 157. Thus, the pixel data of one pixel block that is just stored in the data buffer 157 is set identical to the multiple items of pixel data relative to the block of pixels PB2.

Figure 11B:
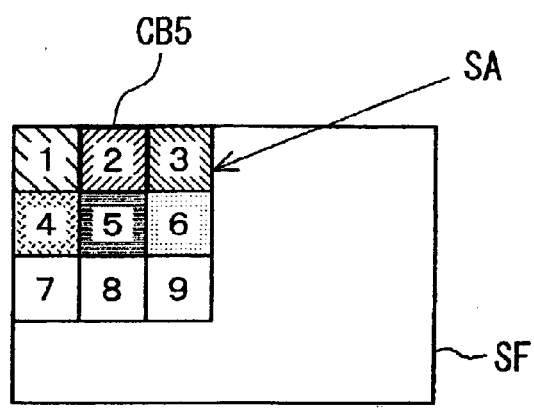
FIGS. 11A and 11B are diagrams for illustrating a series of the operations for generating a candidate block.
Figure 11A:
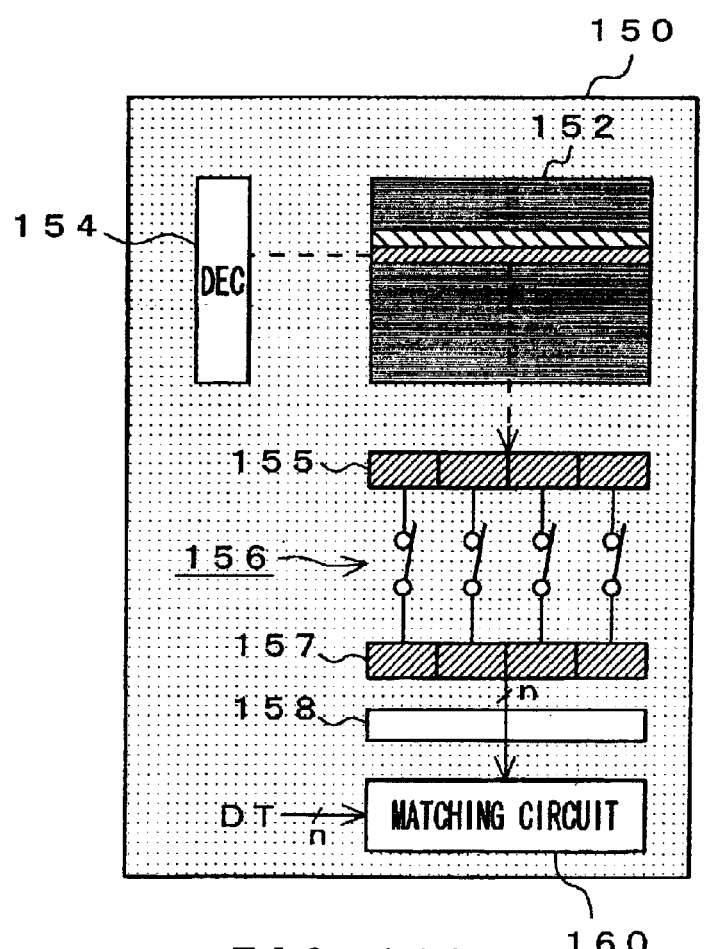

The selector 158 selects the multiple items of pixel data relative to the pixel block PB2 thus stored in the data buffer 157 as the multiple items of pixel data forming the candidate block CB5 that is shifted on a right direction by four pixels relative to the candidate block CB1, and supplies them with the matching circuit 160, as shown in FIG. 11A. The matching circuit 160 then obtains a sum of the absolute difference values for the candidate block CB5 similar to a case of the above candidate block CB1.

Figure 12A:
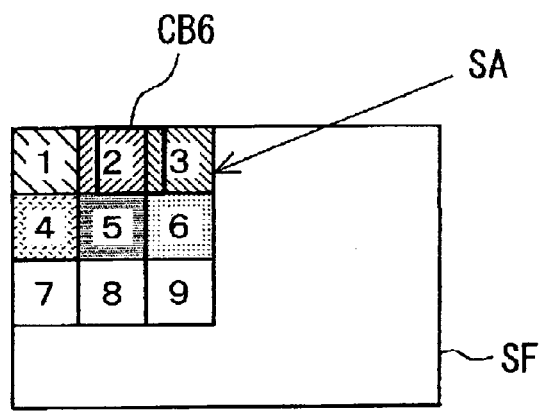
FIGS. 12A and 12B are diagrams for illustrating a series of the operations for generating a candidate block.
Figure 12B:
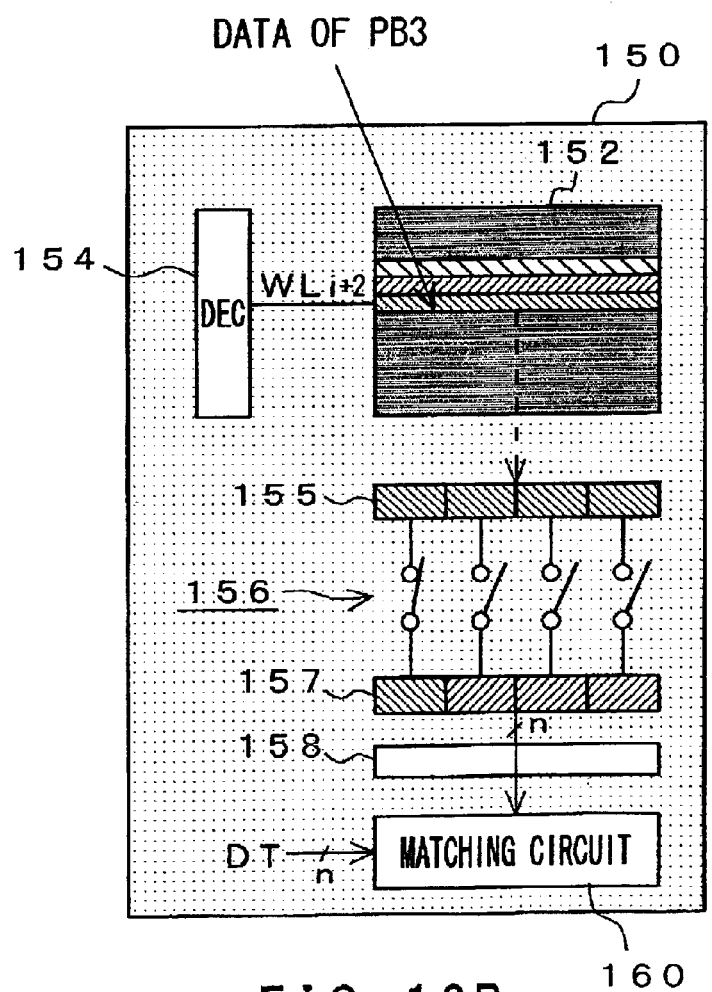

When the word line WLi+2 of the second memory cell array 152 is activated, the multiple items of pixel data of the pixel block PB3 stored in an alignment of the memory cells MC corresponding to the word line WLi+2 are concurrently read out, as shown in FIG. 12B.

The sense amplifier 155 amplifies and outputs bit signals relative to the multiple items of pixel data of the pixel block PB3. In this situation, of switch parts of the switch 156, every switch part which corresponds to four pixels of a first column of the pixel block PB3 starting from the leftmost thereof, turns on. Thus, the pixel data relative to four pixels of a first column of the pixel block PB3 starting from the leftmost thereof, which have been output from the sense amplifier 155, is newly captured on the data buffer 157.

The pixel data of one pixel block that is just stored in the data buffer 157 is set to the multiple items of pixel data forming the candidate block CB6 that is shifted on a right direction by five pixels relative to the candidate block CB1, as shown in FIG. 12A.

The selector 158 selects the multiple items of pixel data forming the candidate block CB6 to supply them with the matching circuit 160. The matching circuit 160 then obtains a sum of the absolute difference values for the candidate block CB6 similar to a case of the above candidate block CB1.

With switch parts of the switch 156 selectively turning on, which is similar to the above cases of the candidate blocks CB3 though CB5, the data buffer 157 stores each of the multiple items of pixel data forming the candidate block CB7 that is shifted on a right direction by six pixels relative to the candidate block CB1, forming the candidate block CB8 that is shifted on a right direction by seven pixels relative to the candidate block CB1, and forming the candidate block CB9 (same position of block of pixels PB3) that is shifted on a right direction by eight pixels relative to the candidate block CB1. The matching circuit 160 then obtains a sum of the absolute difference values for each of the candidate blocks CB7 through CB9.

Figure 13A:
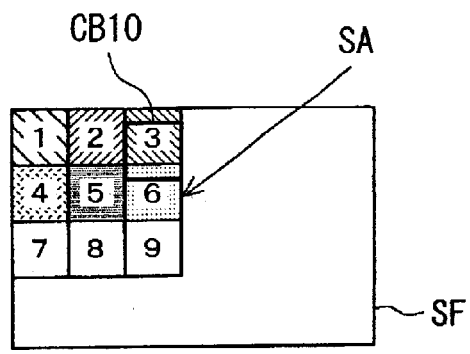
FIGS. 13A and 13B are diagrams for illustrating a series of the operations for generating a candidate block.
Figure 13B:
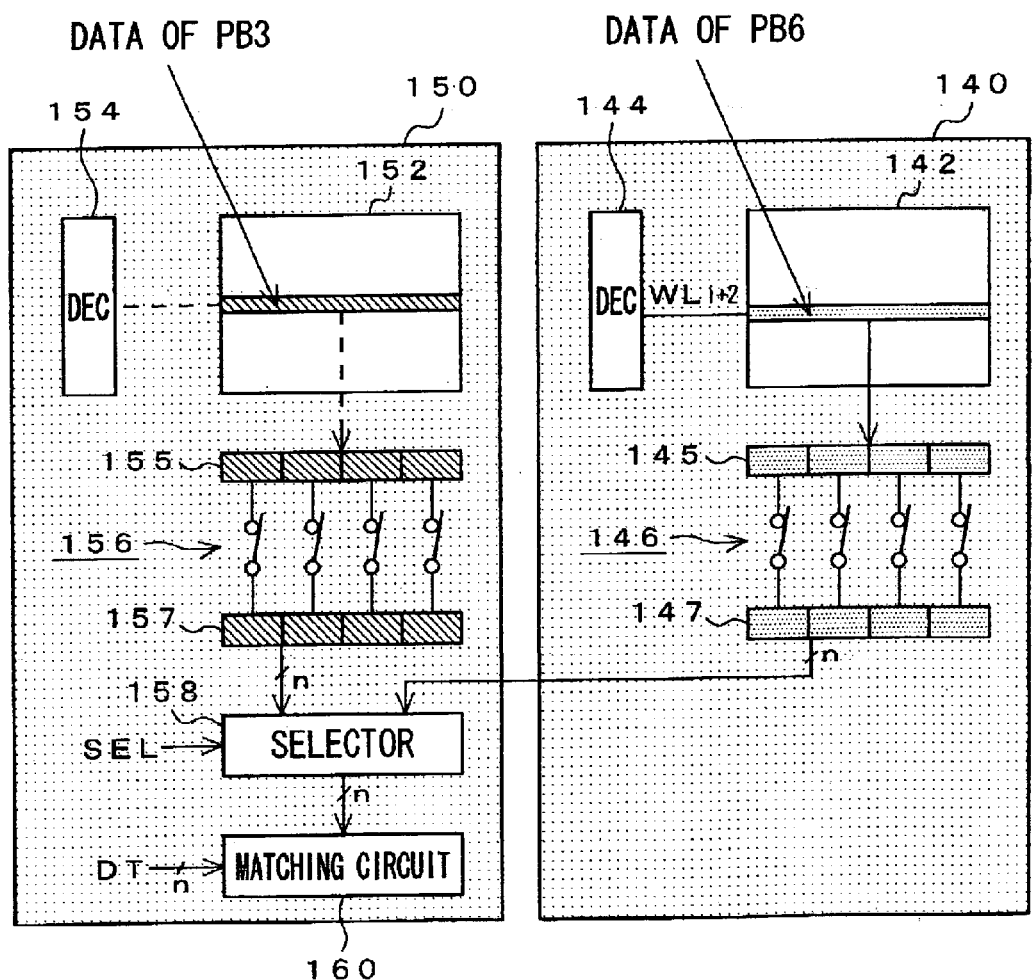

Next, when the word line WLi+2 of the memory cell array 142 of the first memory bank 140 is activated, the multiple items of pixel data of the pixel block PB6 stored in an alignment of the memory cells MC corresponding to the word line WLi+2 are concurrently read out, as shown in FIG. 13B.

The sense amplifier 145 amplifies and outputs bit signals relative to the multiple items of pixel data of the pixel block PB6. In this situation, when all the switch parts of the switch 146 turn on, all the multiple items of pixel data of the pixel block PB6 thus output from the sense amplifier 145 can be newly captured into the data buffer 147.

The selector 158 of the second memory bank 150 then receives the multiple items of pixel data of the pixel block PB6 from the data buffer 147. The selector 158 also receives the multiple items of pixel data of the pixel block PB3 from the data buffer 157.

In this situation, the selector 158 selects and outputs the pixel data of twelve pixels relative to second through fourth rows of the pixel block PB3 starting from uppermost thereof and of four pixels relative to a first row of the pixel block PB6 starting from uppermost thereof.

The pixel data of one pixel block thus selected by the selector 158 is set to the multiple items of pixel data forming the candidate block CB10 that is shifted to a bottom of the search area by one pixel relative to the candidate block CB9 (block of pixels PB3), as shown in FIG. 13A.

The multiple items of pixel data forming the candidate block CB10 are supplied with the matching circuit 160. The matching circuit 160 then obtains a sum of the absolute difference values for the candidate block CB10 similar to a case of the above candidate block CB1.

In the second memory bank 150, the data buffer 157 sequentially stores the multiple items of pixel data forming each of the pixel blocks that are shifted on a left direction in the search area by respective one through eight pixels relative to the block of pixels PB3, which is not shown. At the same time, in the first memory bank 140, the data buffer 147 sequentially stores the multiple items of pixel data forming each of the pixel blocks that are shifted on a left direction in the search area by respective one through eight pixels relative to the block of pixels PB6.

The selector 158 sequentially selects and outputs the multiple items of pixel data forming each of the candidate blocks CB11 through CB18 that are shifted on a left direction by respective one through eight pixels relative to the block of pixels PB10 from the multiple items of pixel data of the respective two pixel blocks stored in the data buffers 147 and 157. The matching circuit 160 then sequentially obtains a sum of the absolute difference values for each of the candidate blocks CB11 through CB18.

The selector 158 of the second memory bank 150 sequentially selects and outputs the candidate blocks CB19 through CB27 that are respective shifted to the bottom of the search area by two pixels, the candidate blocks CB36 through CB28 that are respective shifted to the bottom of the search area by three pixels, and the candidate blocks CB37 through CB45 that are respective shifted to the bottom of the search area by four pixels, relative to the candidate blocks CB1 through CB9, which is similar to the above cases. The matching circuit 160 then obtains a sum of the absolute difference values for each of the candidate blocks CB19 through CB45.

Next, it is necessary for the selector 158 to select and output the multiple items of pixel data forming the candidate blocks CB54 through CB46 that are respective shifted to the bottom of the search area by five pixels, the candidate blocks CB55 through CB63 that are respective shifted to the bottom of the search area by six pixels, the candidate blocks CB72 through CB64 that are respective shifted to the bottom of the search area by seven pixels, and the candidate blocks CB73 through CB81 that are respective shifted to the bottom of the search area by eight pixels, relative to the candidate blocks CB1 through CB9.

In order to implement this, the memory cell array 152 of the second memory bank 150 stores the multiple items of pixel data relative to three pixel blocks PB (the pixel blocks PB7 through PB9) that are horizontally arranged in the third row thereof instead of the multiple items of pixel data relative to three pixel blocks PB (the pixel blocks PB1 through PB3) that are horizontally arranged in the first row thereof.

Thus, the selector 158 of the second memory bank 150 sequentially selects and outputs the multiple items of pixel data forming each of the candidate blocks CB46 through CB81. The matching circuit 160 then sequentially obtains a sum of the absolute difference values for each of the candidate blocks CB46 through CB81.

Thus, the matching circuit 160 of the second memory bank 150 sequentially obtains a sum of the absolute difference values for each of 81 candidate blocks CB1 through CB81 corresponding to the targeted reference block, as described above. The matching circuit 160 transmits a relative position of the reference block presenting the minimum one of the sums of the absolute difference values as the motion vector MV of the targeted reference block.

According to this embodiment, in the first and second memory banks 140, 150, various stages exist during a period starting from a situation that only multiple items of pixel data of a pixel block PB are just captured into the data buffers 147, 157 to a situation that only multiple items of pixel data of another pixel block PB that is horizontally adjacent to the pixel block PB are just captured into the data buffers 147, 157. For example, the stage that the multiple items of pixel data forming each of the candidate blocks CB1 through CB5 are captured into the data buffer 157 (referring to FIGS. 8–11) may be implemented by only the following proceedings of: reading multiple items of pixel data of a pixel block PB by activating a word line; capturing them into the data buffers 147, 157; reading multiple items of pixel data of another pixel block PB that is adjacent to the pixel block PB by activating a word line that is adjacent to the above word line; and sequentially capturing multiple items of pixel data thus read into the data buffers 147, 157 using the switches 146, 156. This allows numbers of time of the access into the memory array 142, 152 to be limited, thereby shortening the operation time for obtaining the motion vector.

According to the invention, each of the alignments of the memory cells MC arranged in a column direction of the each of the memory cell arrays 142 and 152, each alignment corresponding to each of the word lines that are arranged in rows and extend in the column direction in each of the memory cell arrays 142 and 152, stores the multiple items of pixel data relative to the pixel blocks PB of a row set in a horizontal way in a search area within a search frame of picture signal. This allows the multiple items of pixel data relative to the pixel block PB to easily be written and read by only activating the corresponding one word line.

Although it has been described in the embodiment that the motion vector detection circuit 124 comprises the first and second memory banks 140, 150, as shown in FIG. 4, further memory banks may be added thereto. For example, a third memory bank having the same configuration as that of the first memory bank 140 is provided so that a memory cell array therein may store the multiple items of pixel data relative to three pixel blocks PB (the pixel blocks PB7 through PB9) that are horizontally arranged in a third row in the search area. The multiple items of pixel data of one pixel block that is output from a data buffer therein may be supplied with the selector 158 of the second memory bank 150.

Although, in this embodiment, the pixel block is composed of four pixels by four pixels and the search area is composed of three pixel blocks by three pixel blocks in a middle of a pixel block corresponding to the reference block, the invention is not limited thereto.

Although, in this embodiment, the memory block according to the invention is applied to the motion vector detection circuit 124, one skilled in the art may naturally adapts it to another circuit that requires the acquirement of various stages existing during a period starting from a situation that only multiple items of pixel data are just captured to a situation that only other multiple items of pixel data are just captured.

Although, in this embodiment, the memory block according to the invention is applied to the pixel data, it may be of course applied to other data such as audio data.

Another embodiment of the present invention will be described more in detail in view of the accompanying drawings.

Figure 14:
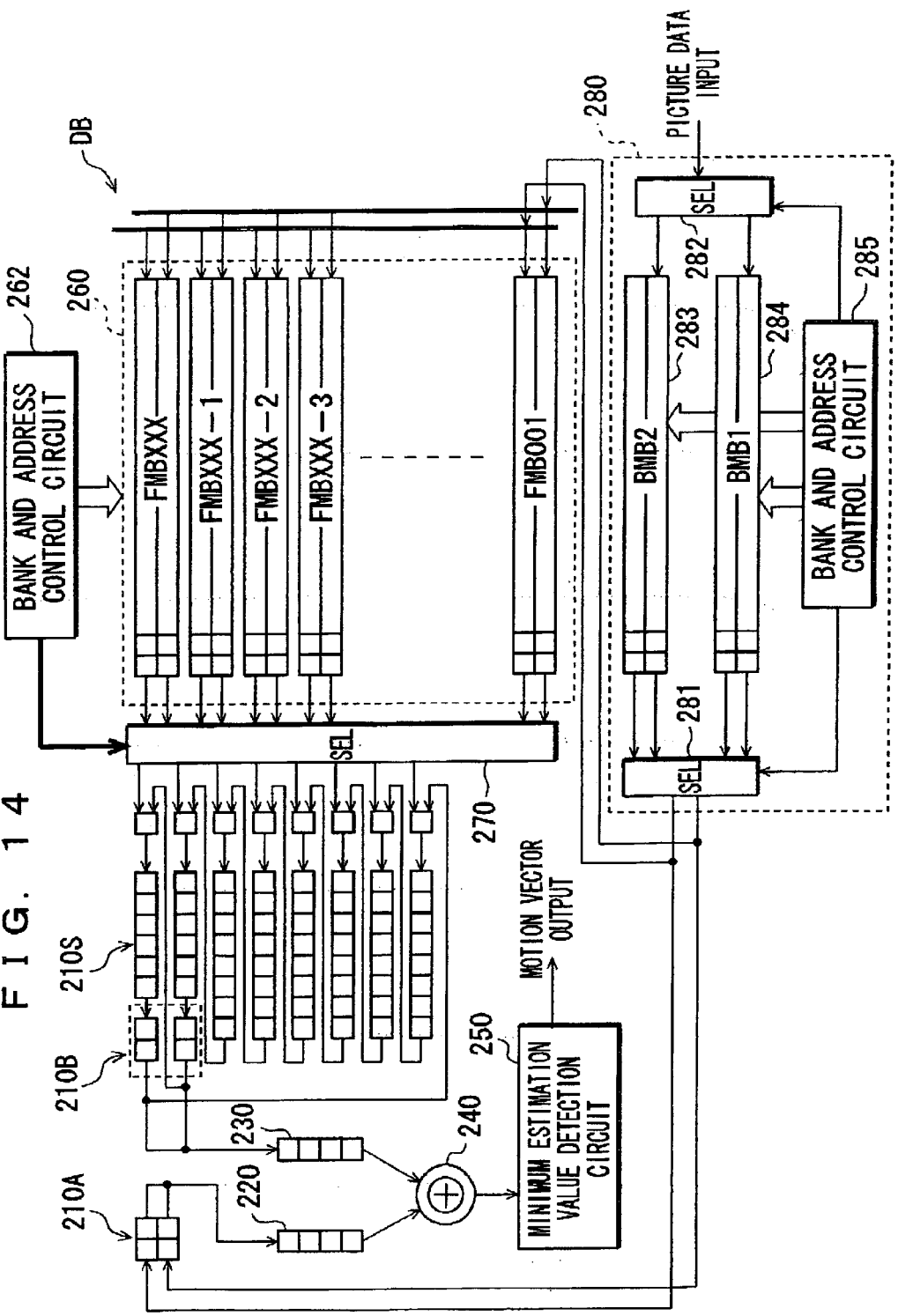
FIG. 14 is a block diagram for illustrating a configuration of another embodiment of an apparatus for processing data according to the invention.

FIG. 14 shows a configuration of an apparatus for processing data according to this embodiment of the invention. This apparatus according to this embodiment comprises a shift memory 210S, a reference block register 220, a candidate block register 230, a comparison circuit 240, a minimum estimation value detection circuit 250, a frame memory 260, a selector 270 and a block conversion circuit 280.

Further, a bank and address control circuit 262 is provided in relation to the frame memory 260.

The above components of the apparatus for processing data of this embodiment may be formed on one semiconductor chip. Namely, the frame memory 260 and a processing circuit for processing motion estimation on the picture data stored in the frame memory 260 on a frame unit basis are formed on one semiconductor chip so that they can be formed as a semiconductor chip having various functions.

The above components of the apparatus for processing data of this embodiment will be described more in detail.

The shift memory 210S comprises shift register trains of multiple stages as shown in FIG. 14. The shift memory 210S corresponds to a search area in a search frame and stores all the pixel data in the search area with the pixel data corresponding to each of the positions of pixels.

The selector 270 selects a predetermined memory bank from the frame memory 260. In the shift memory 210S, each shift register holds pixel data read out of the selected memory bank. As shown in FIG. 14, the shift register trains are connected with each other in series. While the pixel data held on each of the shift register trains is sequentially shifted, the shift register train of the former stage receives the pixel data held on the shift register train of the latter stage. The pixel data output from the shift register train of the uppermost stage is fed back to the shift register train of the lowermost stage. This allows the pixel data held on the shift memory 210S to be cyclically shifted.

In the shift memory 210S, the data relative to a predetermined number of the pixels that is positioned at left upper end of the shift memory 210S is output to the candidate block register 230, as shown in FIG. 14. A candidate block in the search area is composed of the pixels in shift registers 210B of this shift memory 210S. Each of the shift registers 210B holding the pixel data relative to the candidate block has a different configuration from other shift registers of the shift memory 210S. These shift registers 210B have data output line for directly outputting the held data to the outside. The data output from the data output line is written to the candidate block register 230. Each of the shift registers 210B has a system such that, if the held data is read out thereof, they can avoid damage to the data and keep it as it is. Typical one of such the shift registers is a so-called master-slave typed shift register.

Every pixel data of the candidate block is read out and held on the candidate block register 230 and each pixel data of the reference block is read out and held on the reference block register 220. Every pixel data in the reference block register 220 and the candidate block register 230 is subject to the logic operation EXCLUSIVE OR (XOR) every bit and the data is compared with each other in relation to all the pixels relative to the reference block register 220 and the candidate block register 230. As shown in FIG. 14, the comparison circuit 240 and the minimum estimation value detection circuit 250 performs various processes on a result of the comparison to obtain the motion vector MV based on the result thereof.

According to this embodiment, the reference block and the candidate block are respectively composed of four pixels that are vertically and horizontally arranged as two pixels by two pixels. This invention, however, is not limited thereto. Any other size of the reference block and the candidate block may be also used. For example, the reference block and the candidate block may be respectively composed of 16 pixels that are vertically and horizontally arranged as four pixels by four pixels. Note that the pixels subject to the comparison in the block-matching process increases in number with the pixels in the reference block increasing in number. This requires larger capacity of the register for holding pixel data of the reference block and the candidate block as well as larger processing capacity of the operation circuit.

Referring back to FIG. 14, the reference block register 220 holds every pixel data relative to the reference block selected by the selector 281 in the block conversion circuit 280.

While the data stored in the shift memory 210S is shifted by one pixel, the candidate block is made equivalent to one shifted by one pixel in the entire search area. In other words, every pixel data stored in the reference block register 220 and the candidate block register 230 is compare with each other one by one with the data stored in the shift memory 210S being shifted by one pixel. This allows the equivalent comparison by one pixel to be implemented with the reference block being shifted by one pixel. Namely, a block-matching process to the entire search area may be implemented using the reference block. Performing cyclic comparison of the data stored in the shift memory 210S relative to one reference block allows the reference block to perform the block-matching process on the entire search area. The motion vector MV may be calculated according to the minimum value detected by the minimum estimation value detection circuit 250, which will be described later.

The comparison circuit 240 performs the logic operation EXCLUSIVE OR (XOR) every bit on every pixel data in the reference block register 220 and the candidate block register 230. The comparison circuit 240 then outputs operated results thereof to the minimum estimation value detection circuit 250.

The minimum estimation value detection circuit 250 receives the operated results of the logic operation EXCLUSIVE OR (XOR) on every pixel data in the reference block register 220 and the candidate block register 230 from the comparison circuit 240. The minimum estimation value detection circuit 250 calculates a sum of bit numbers making 1, namely, a sum of absolute difference of every pixel data, relative to the operated results of the logic operation EXCLUSIVE OR (XOR). The circuit 250 then compares the sum of absolute difference with the minimum sum of the absolute difference obtained up to the last calculation. When the sum of absolute difference is not more than the minimum sum of the absolute difference obtained up to the last calculation, the circuit 250 allows for storing this sum of absolute difference as a new minimum absolute difference. Further, the numbers of shifting corresponding to this minimum absolute difference, namely, items of the positional information of the candidate block in the search area are stored therein at the same time.

When the shift register 210S shifts every pixel data for one cycle back to the original start position thereof, the circuit 250 transmits as motion vector MV the positional information of the candidate block corresponding to the minimum value of the absolute difference detected thereby.

The frame memory 260 comprises multiple memory banks FMBXXX through FMB001 that run parallel. Each of the memory banks receives the data from the data bus DB and stores the data. The selector 270 selects memory bank(s) to read every data or a part of the data stored in the selected memory bank(s). The shift memory 210S receives the data thus read from the frame memory 260 through the selector 270.

Note that in the frame memory 260, a bank and address control circuit 262 specifies the memory bank and memory address in the specified memory bank, thereby allowing the pixel data to be written or read to or from the specified memory bank.

The frame memory 260 usually has a volume for allowing it to store the data of one frame of the picture signal subject to the processing and of several extra blocks thereof. When processing the picture signal, the frame memory 260 stores the data of one frame of the picture signal and of several extra blocks thereof. The address for writing the data in the frame memory 260 is set so as to be away from that for reading the data of the picture signal by one frame. Writing the data in the frame memory 260 may be carried out every one frame of the input picture signal. Parallel reading of the data from the frame memory 260 may be carried out in relation of several blocks.

Note that numbers of blocks thus parallel read may be set, for example, according to the numbers of lines in the search area. Suppose that each memory bank of the frame memory 260 stores the picture signal by two lines and that the search area includes the data of eight lines. When reading, the data of four memory banks is read out of the frame memory 260 in parallel and written to the shift memory 210S.

The block conversion circuit 280 sequentially receives the picture signal on a pixel basis and converts the separate pixel data to blocked one to output the pixel data on a block basis. The block conversion circuit 280 comprises selectors 281, 282, memory banks 283, 284, and a bank and address control circuit 285, as shown in FIG. 14.

The memory banks 283 and 284 store the picture data alternately input. One memory bank reads the stored picture data out of the other memory bank while the picture data is written into the one memory bank and transmits the picture data thus read to the reference block register 220 and the frame memory 260.

The memory banks 283, 284 have the almost same capacity as each of the memory banks forming the frame memory 260 has. For example, they can store the data of two lines in the picture signal. The selectors 281, 282 select any one of the memory banks 283, 284 to switch them. The bank and address control circuit 285 controls the operations of selectors 281, 282 and allows for addressing the selected memory bank.

The pixel data of the predetermined search area is read out of the picture signal of the last frame relative to the picture signal currently input into the frame memory 260 and the block conversion circuit 280. The shift memory 210S stores the pixel data thus read. The pixel data relative to the reference block is read out of a predetermined position in the picture signal of one frame that is currently input. The reference block register 20 then holds this pixel data relative to the reference block. In the shift memory 210S, the pixel data relative to the candidate block is read out of a predetermined position in the search area. The candidate block register 30 then holds this pixel data relative to the candidate block.

FIG. 15 is a conceptual diagram for illustrating operations of an apparatus for processing data according to this embodiment. The operations of the apparatus for processing data according to this embodiment having the above configuration will be described with referring to FIGS. 14 and 15.

Referring to FIG. 14, the block conversion circuit 280 receives the input picture data. The picture data is stored in the memory bank selected by the selector 282. The picture data is read out of one memory bank while the picture data is written into the other memory bank. At the same time, the selector 81 selects the memory bank into which the picture data is first written. The picture data stored in the selected memory bank then is sequentially read out thereof. The reference block register 220 holds the picture data thus read and then the frame memory 260 also receives it. Since each memory bank sequentially stores the picture data in the frame memory 260, the frame memory 260 may finally store the picture data of one frame and several blocks.

The selector 270 selects the pixel data corresponding to a predetermined search area from the picture data of one frame or more thus stored in the frame memory 260 and outputs it to the shift memory 210S.

Referring to FIG. 15, the shift register 210S holds the input pixel data corresponding to the search area and circulates the pixel data thus held with it being shifted by one pixel. This allows every pixel data corresponding to the search area to be sequentially held on the candidate block register 230. On the other hand, every pixel data relative to the reference block is held on the reference block register 220.

The comparison circuit 240 performs the logic operation EXCLUSIVE OR (XOR) every bit on every pixel data in the reference block register 220 and the candidate block register 230. The comparison circuit 240 outputs the operated results thereof to the minimum estimation value detection circuit 250. Thus, in the shift memory 210S, every time that the pixel data is shifted by one pixel, every pixel data in the candidate block is output to the candidate block register 230 where the logic operation EXCLUSIVE OR (XOR) every bit is repeated on every pixel data in the reference block register 220 and the candidate block register 230.

The minimum estimation value detection circuit 250 compares the value received from the comparison circuit 240 with the minimum one of the values obtained up to the last calculation. When the result of comparison indicates that a newly received value is not more than the minimum value, the minimum value is updated as the new minimum. The minimum estimation value detection circuit 250 also stores positional information of the candidate block corresponding to this new minimum value. In the shift memory 210s, the motion vector MV can be obtained according to the positional information of the reference block corresponding to the minimum value stored in the minimum estimation value detection circuit 250 when the circuit 250 has shifted every pixel data for one cycle.

FIGS. 16A and 16B are views for illustrating the reference blocks of current frame in the detection processing for the motion vector MV and sampled pictures positioned in the search area of the past frame. In the embodiment, as shown in FIGS. 16A, 16B, the reference block RB is composed of the pixel data, in a predetermined area, that is obtained from a current picture signal of one frame. The candidate block CB is composed of the pixel data in a predetermined area in the search area SA, in this embodiment shown in FIGS. 16A, 16B, left upper portion of the search area SA. Note that the candidate block CB has the same size, namely, same numbers of pixels, as the reference block RB has.

When the pixel data positioned in the search area SA is circulated with pixel data being shifted by one pixel, the entire picture is shifted in the search area SA, as shown in FIG. 16B, so that a part of picture SA1 excluding from the search area SA can appear in the opposite side of the search frame SF in direction to the shift of picture. Thus, comparing the candidate block CB with the reference block RB with the pixel data in the search area SA being shifted by one pixel allows determining where a portion of the picture that is closest to the reference block of the current frame is positioned in the past frame. This permits a motion vector MV indicating a shift direction and a shift distance of the reference block RB between the frames to be obtained.

Next, a configuration of each of the comparison circuit 240 and the minimum estimation value detection circuit 250 will be described with referring FIGS. 17 and 18.

FIG. 17 shows a configuration of the comparison circuit 240. The comparison circuit 240 is composed of multiple EXCLUSIVE-OR gates that are arranged in parallel, as shown in FIG. 17. Each of the EXCLUSIVE-OR gates receives the data of each bit of the reference block register 220 via one input terminal thereof and the data of each bit of the candidate block register 230 via the other input terminal thereof. These EXCLUSIVE-OR gates output a value DE having a predetermined number of bits via their output terminal.

Numbers of the EXCLUSIVE-OR gates forming the comparison circuit 240 are identical to those of the reference block register 220 or the candidate block register 230 or more. In an example shown in FIG. 17, the reference block register 220 and the candidate block register 230 are respectively composed of four pixels. If each pixel data is set to 16-bit data, at least 64 EXCLUSIVE-OR gates are required therefor. These EXCLUSIVE-OR gates output the estimation value DE that is 64 bit-data, based on whether the pixel data of the reference block register 220 and the candidate block register 230 is agreed with each other every bit in relation to every pixel data thereof. When bits of the pixel data of the reference block register 220 and the candidate block register 230 are agreed with each other, EXCLUSIVE-OR gates corresponding thereto output the data, "0". On the other hand, when bits of the pixel data of the reference block register 220 and the candidate block register 230 are not agreed with each other, EXCLUSIVE-OR gates corresponding thereto output the data, "1". Thus, according to numbers of bits indicating "1" (or "0") in the estimation value DE, it is determined how every pixel data of the reference block register 220 and the candidate block register 230 is closed to each other.

The minimum estimation value detection circuit 250 for estimating whether the reference block register 220 and the candidate block register 230 are agreed according to the estimation value DE will be described.

Figure 18:
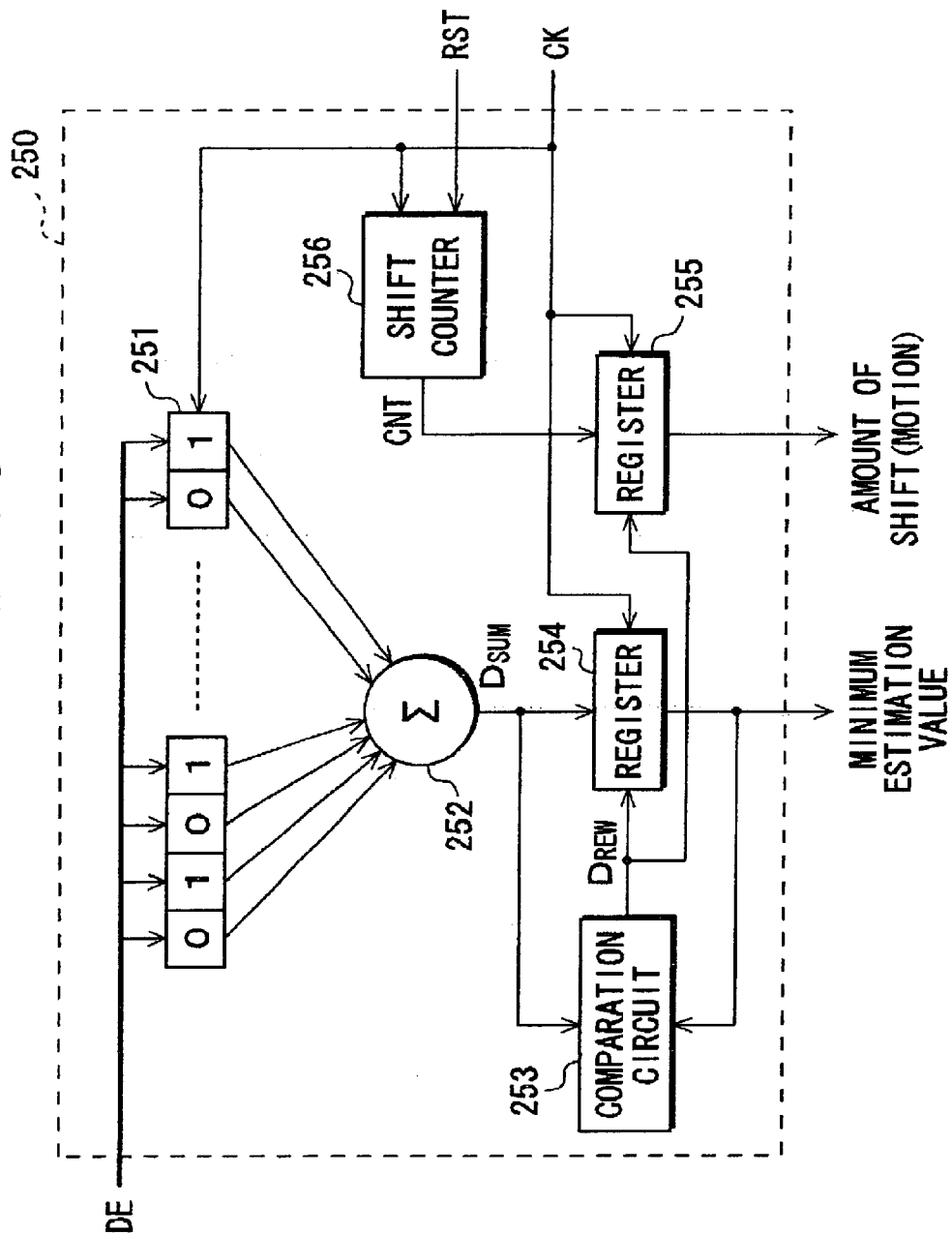
FIG. 18 is circuit diagram for illustrating a detection circuit, shown in FIG. 14, for detecting minimum evaluation value.

FIG. 18 shows a configuration of the minimum estimation value detection circuit 250. The circuit 250 comprises an estimation value register 251, an accumulator 252, a comparison circuit 253, registers 254, 255, and shift counter 256, as shown in FIG. 18.

The estimation value register 251 receives and holds all the bits of the estimation value DE from the comparison circuit 240 and outputs the data of each bit thus held to the accumulator 252.

The accumulator 252 accumulates all the bits of the estimation value DE to obtain the data $D_{SUM}$. The accumulator 252 outputs the data $D_{SUM}$ to the comparison circuit 253 and the register 254.

Referring back to FIG. 14, in the shift memory 210s, the stored data is circulated with it being shifted by one pixel. The comparison circuit 240 compares all the bits of the reference block register 220 and the candidate block register 230 with each other every time the data is shifted by one pixel. Thus, the estimation value DE output from the comparison circuit 240 is updated every time the data is shifted by one pixel in the shift memory 210S.

The register 254 holds the data $D_{SUM}$ of accumulated result in the accumulator 252 and outputs it to the comparison circuit 253.

The comparison circuit 253 compares the data $D_{SUM}$ of accumulated result in the accumulator 252 with the last accumulated result held on the register 254 so that it can compare the data $D_{SUM}$ of the current accumulated result with the last accumulated result held on the register 254. When the current accumulated result DE is not more than the last accumulated result, the comparison circuit 253 outputs a data update instruction signal $D_{REW}$ to the registers 254, 255.

When the registers 254 receives the data update instruction signal $D_{REW}$ from the comparison circuit 253, it holds the current accumulated result DE. When the registers 254 receives no data update instruction signal $D_{REW}$ from the comparison circuit 253, it holds the last accumulated result as it is.

Similarly, the register 255 updates the held data based on a count value CNT output from the shift counter 256 according to the data update instruction signal $D_{REW}$ from the comparison circuit 253. When the registers 255 receives no data update instruction signal $D_{REW}$ from the comparison circuit 253, it holds the last count value as it is.

The shift counter 256 updates the count value CNT according to a clock signal CK. Namely, the shift counter 256 adds or subtracts one to or from the count value CNT every one cycle of the clock signal CK. Further, the shift counter 256 receives a reset signal RST. When the shift memory 210S shown in FIG. 14 receives new data relative to the search area SA, this reset signal RST is made active. This allows the shift counter 256 to reset the count value CNT.

In other words, when the shift memory 210S stores new data relative to the search area SA, the count value CNT of shift counter 256 is reset. When the data stored in the shift memory 210S is shifted by one pixel, the count value CNT of shift counter 256 is updated. In other words, the count value CNT of shift counter 256 indicates numbers of shifting the data in the shift memory 256. Based on the numbers of shifting, a position of the candidate block output from the shift memory 210S in the search area SA can be calculated.

When the comparison circuit 253 outputs the data update instruction signal $D_{REW}$ in the minimum estimation value detection circuit 250 shown in FIG. 18, the register 254 holds the new accumulated result $D_{SUM}$ while the register 255 holds the count value CNT of shift counter 256. Thus, when the shift memory 210S shifts the stored data relative to the search area SA for one cycle, the register 254 holds the minimum estimation value and the register 255 holds the count value CNT of shift counter 256, namely, the numbers of shifting, which corresponds to the minimum estimation value. Based on the numbers of shifting, a position of the candidate block in the search area SA when obtaining the minimum estimation value can be calculated, thereby obtaining the motion vector MV according to the position.

Thus has been described the apparatus for processing data of this embodiment wherein the pixel data relative to the search area SA is read out of the picture data of one frame that is stored in the frame memory 260; the shift memory stores the pixel data thus read; the pixel data corresponding to a predetermined candidate block is read out of the picture data stored in the shift memory 260; the candidate block register 230 holds the pixel data thus read; the comparison circuit 240 compares every pixel data of the reference block register 220 and the candidate block register 230 bit by bit; the minimum estimation value detection circuit 250 detects the minimum value of the comparison results and obtains the positional information of the candidate block according thereto; and the motion vector MV is calculated according to the positional information of the candidate block detected by the minimum estimation value detection circuit 250 when the shift memory 10S shifts every pixel data for one cycle.

Thus has been described an apparatus for processing data, memory bank used therefor, semiconductor device, and method for reading out pixel data. While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for processing data, said apparatus comprising:
   frame memory for storing data of at least one frame, said data being input on a frame basis;
   shift memory for holding data of a predetermined search area, and shifting said held data one by one, said predetermined search area being selected in said frame memory;
   comparison means for comparing multiple items of data stored in plural memories positioned at predetermined positions in said shift memory with a predetermined data subject to the comparison; and
   data processing means for receiving and processing data held on the shift memory with the data shifting to obtain shift information relative to said predetermined positions based on a comparison result by said comparison means when the difference between said multiple items of data stored in plural memories positioned at predetermined positions in said shift memory and said predetermined data subject to the comparison is minimum.

2. The apparatus for processing data according to claim 1, wherein said shift memory cyclically shifts said data held thereon.

3. The apparatus for processing data according to claim 1, wherein said comparison means has difference arithmetical operation means for performing an arithmetical operation on said multiple items of data stored at predetermined positions in said shift memory and said predetermined data subject to the comparison to obtain difference value between said multiple items of stored data and said predetermined data subject to the comparison.

4. The apparatus for processing data according to claim 3, wherein, when difference value output from said difference arithmetical operation means is not more than difference value that has been calculated in last time, said data processing means receives said difference value output from said difference arithmetical operation means and positional information relative to said predetermined position in said shift memory, said positional information corresponding to said difference value thus received from said difference arithmetical operation means; and wherein said data processing means obtains shift information relative to said predetermined positions based on said positional information.

5. The apparatus for processing data according to claim 1, wherein said data subject to the comparison comprises multiple items of data stored in predetermined positions in the data of one frame that is delayed in input thereof by one frame after inputting said data stored in said frame memory.

6. The apparatus for processing data according to claim 1, wherein plural memories positioned at said predetermined positions in said shift memory have a data output line for outputting said stored data with the stored data being shifted.

7. The apparatus for processing data according to claim 6, further comprising:
   first data holding means for holding said data subject to the comparison; and
   second data holding means for holding data stored in said plural memories positioned at said predetermined positions in said shift memory, said data being output from said data output line.

8. The apparatus for processing data according to claim 7, wherein said comparison means has logic circuit for performing logic operation EXCLUSIVE OR every bit between the data held in said first data holding means and the data held in said second data holding means.

9. The apparatus for processing data according to claim 8, wherein said data processing means comprises:
   accumulator for accumulating every bit of data output from the logic circuit for performing the logic operation EXCLUSIVE OR;
   counter for counting shifted number of times in said shift memory;
   first storage device for storing output from said accumulator when said output from said accumulator is not more than the last output thereof; and
   second storage device for storing count value from said counter when said output from said accumulator is not more than the last output thereof, wherein said data processing means transmits shift information relative to said predetermined position based on said count value stored on said second storage device when a cyclic process of reading every stored data out of said shift memory has been performed.

10. Semiconductor device formed as a semiconductor chip, said device comprising:
    memory for storing data that is input on a predetermined unit basis;
    shift memory for holding data of a predetermined search area, and shifting said held data one by one, said predetermined search area being selected in said memory;
    comparison means for comparing multiple items of data stored in the plural memories positioned at predetermined positions in said shift memory with a predetermined data subject to the comparison; and
    data processing means for receiving and processing data held on the shift memory with the data shifting to obtain shift information relative to said predetermined positions based on a comparison result by said comparison means when the difference between said multiple items of data stored in the plural memories positioned at predetermined positions in said shift memory and said predetermined data subject to the comparison is minimum.

11. Method for processing data comprising the steps of:
    storing the data of at least one frame on frame memory, said data being input on a frame basis;
    selecting a predetermined search area in said frame memory, holding data of said selected search area, and shifting said data held on the shift memory one by one;
    comparing multiple items of data stored in the plural memories positioned at predetermined positions in said shift memory with a predetermined data subject to the comparison; and
    obtaining shift information relative to said predetermined positions with the data held on said shift memory being shifted according to a comparison result by said comparison means when the difference between said multiple items of data stored in the plural memories positioned at predetermined positions in said shift memory and said predetermined data subject to the comparison is minimum.

* * * * *